United States Patent
Sambonsugi et al.

(10) Patent No.: US 10,720,464 B2
(45) Date of Patent: Jul. 21, 2020

(54) IMAGING APPARATUS AND METHOD FOR DRIVING THE SAME

(71) Applicant: CANON KABUSHIKI KAISHA, Tokyo (JP)

(72) Inventors: Hideaki Sambonsugi, Tokyo (JP); Mineo Uchida, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 131 days.

(21) Appl. No.: 15/943,489

(22) Filed: Apr. 2, 2018

(65) Prior Publication Data

US 2018/0294306 A1 Oct. 11, 2018

(30) Foreign Application Priority Data

Apr. 10, 2017 (JP) ................................. 2017-077666

(51) Int. Cl.
| | |
|---|---|
| H01L 27/146 | (2006.01) |
| H04N 5/341 | (2011.01) |
| H04N 5/232 | (2006.01) |
| H01L 27/148 | (2006.01) |
| H04N 5/378 | (2011.01) |
| H04N 5/369 | (2011.01) |
| H04N 5/361 | (2011.01) |
| H04N 5/235 | (2006.01) |

(52) U.S. Cl.
CPC .. *H01L 27/14643* (2013.01); *H01L 27/14605* (2013.01); *H01L 27/14818* (2013.01); *H04N 5/2352* (2013.01); *H04N 5/23212* (2013.01); *H04N 5/23229* (2013.01); *H04N 5/341* (2013.01); *H04N 5/361* (2013.01); *H04N 5/36961* (2018.08); *H04N 5/378* (2013.01)

(58) Field of Classification Search
CPC ......... H01L 27/14643; H01L 27/14818; H01L 27/14605
See application file for complete search history.

(56) References Cited

U.S. PATENT DOCUMENTS

2010/0128150 A1* 5/2010 Taguchi ............... H04N 5/2176
348/243

FOREIGN PATENT DOCUMENTS

JP 2001-124984 A 5/2001

* cited by examiner

*Primary Examiner* — Tony Ko
(74) *Attorney, Agent, or Firm* — Canon U.S.A., Inc. IP Division

(57) ABSTRACT

An imaging apparatus includes a pixel region having a plurality of unit pixels arranged in a matrix, each of the unit pixels including first and second photoelectric conversion units, a reading controller configured to read first signals obtained by mixing signals output from the first and second photoelectric conversion units in rows of a first reading mode and read second signals at least including signals of the first photoelectric conversion units and third signals at least including signals of the second photoelectric conversion units in rows of a second reading mode, and an OB clamp processor configured to correct signals in the unit pixels included in an opening region in the pixel region based on signals output from the unit pixels included in a light shielding region in the pixel region. The OB clamp processor performs one of various correction processes depending on an imaging condition.

20 Claims, 26 Drawing Sheets

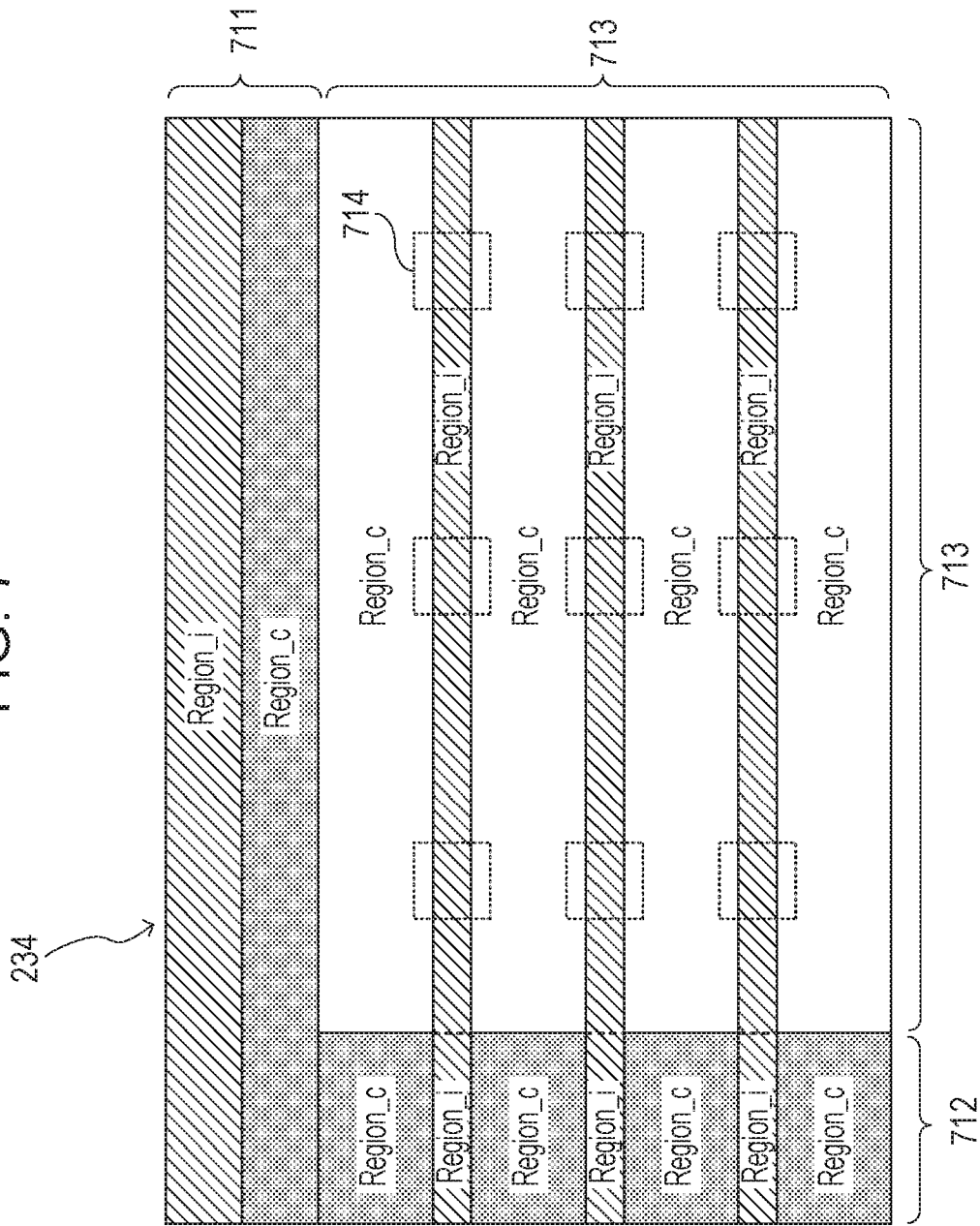

IMAGING APPARATUS AND METHOD FOR DRIVING THE SAME

BACKGROUND OF THE INVENTION

Field of the Invention

The present disclosure relates to an imaging apparatus and a method for driving the imaging apparatus.

Description of the Related Art

In recent years, imaging apparatuses employing an imaging element, such as a complementary metal-oxide semiconductor (CMOS) sensor, have a large number of functions and perform control of focus adjustment, for example, based on object information obtained by the imaging element in addition to generation of a captured image, such as a still image or a moving image. Japanese Patent Laid-Open No. 2001-124984 discloses a technique of focus detection of a pupil division method using a signal obtained from an imaging element. In Japanese Patent Laid-Open No. 2001-124984, each pixel in the imaging element has a single micro lens and two photodiodes. The different photodiodes receive light transmitted through different pupils of an imaging lens. The focus detection is enabled by comparing signals output from the two photodiodes with each other, and in addition, a captured image is generated by adding the signals output from the two photodiodes to each other.

SUMMARY OF THE INVENTION

An imaging apparatus according to an embodiment includes a pixel region having a plurality of unit pixels arranged in a matrix, each of the unit pixels including first and second photoelectric conversion units, a reading controller configured to read first signals obtained by mixing signals output from the first and second photoelectric conversion units in rows of a first reading mode and read second signals at least including signals of the first photoelectric conversion units and third signals at least including signals of the second photoelectric conversion units in rows of a second reading mode, and an optical black (OB) clamp processor configured to correct signals in the unit pixels included in an opening region in the pixel region based on signals output from the unit pixels included in a light shielding region in the pixel region. The OB clamp processor performs one of various correction processes depending on an imaging condition.

Further features of the disclosure will become apparent from the following description of exemplary embodiments with reference to the attached drawings.

BRIEF DESCRIPTION OF THE DRAWINGS

FIG. 7 is a diagram illustrating reading of the imaging element according to the first embodiment.

DESCRIPTION OF THE EMBODIMENTS

First Embodiment

Figure 1:
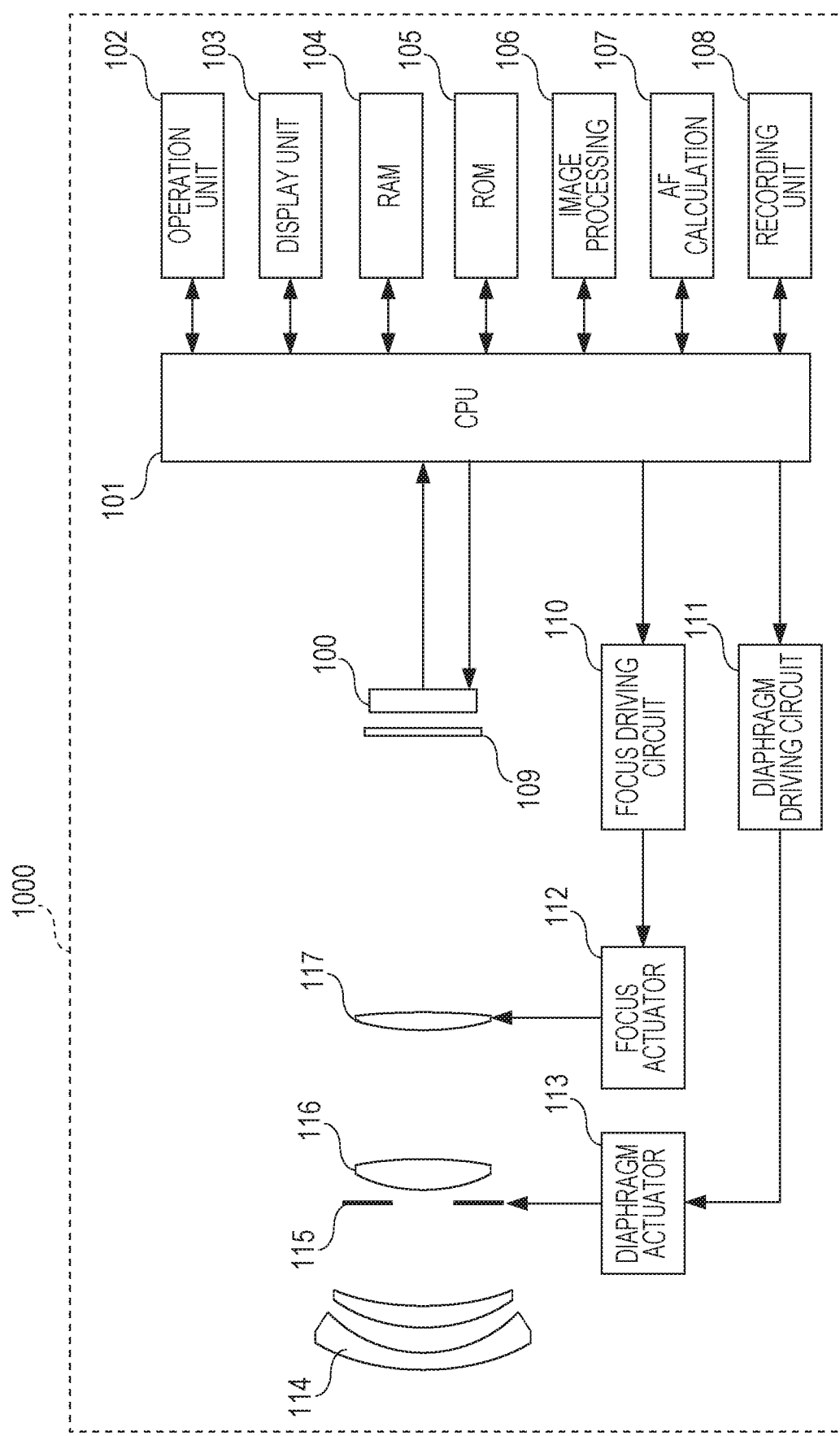
FIG. 1 is a diagram illustrating an example of a configuration of an imaging apparatus according to a first embodiment.

FIG. 1 is a block diagram illustrating an example of a configuration of an imaging apparatus 1000 according to a first embodiment of the present disclosure. The imaging apparatus 1000 is applicable to smartphones, tablet terminals, industrial cameras, medical cameras, and the like in addition to digital still cameras and camcorders. Although the imaging apparatus 1000 is constituted by integrating an imaging apparatus body (a camera body) and an imaging lens (an imaging optical system) in FIG. 1, the present disclosure is not limited to this and is applicable to an imaging apparatus having an imaging lens attached to an imaging apparatus body in a replaceable manner. Furthermore, the imaging apparatus 1000 has a function as a focus detection apparatus in the embodiment described below, and therefore, the imaging apparatus 1000 serves as a focus detection apparatus.

The imaging apparatus 1000 includes an imaging element 100, a central processing unit (CPU) 101, an operation unit 102, a display unit 103, a random access memory (RAM) 104, a read only memory (ROM) 105, an image processor 106, an auto focus (AF) calculation unit 107, and a recording unit 108. The imaging apparatus 1000 further includes a focal plane shutter 109, a focus driving circuit 110, a diaphragm driving circuit 111, a focus actuator 112, and a diaphragm actuator 113. The imaging apparatus 1000 further includes a first lens group 114, a second lens group 116, a diaphragm 115, and a third lens group 117.

The imaging element 100 has a function of capturing moving images or still images. The imaging element 100 converts an optical image of an object (an object image)

formed by an imaging optical system into an electric signal. Furthermore, the imaging element 100 converts the converted electric signal in accordance with a certain quantized bit into a digital signal (image data) to be output. Driving of the imaging element 100 is controlled by the CPU 101. Note that, although the example in which the imaging element 100 outputs a digital signal is illustrated in the example of FIG. 1, the present disclosure is not limited to this. For example, the imaging element 100 may output an analog signal and an analog/digital converter disposed independently from the imaging element 100 may convert the analog signal into a digital signal.

The CPU 101 has a function of a controller which integrally controls the imaging apparatus 1000. The image processor 106 performs a process of correcting image data obtained as a result of imaging, a process of compressing the image data, and the like, which will be described below. The RAM 104 is a memory (an image memory) which stores image data output from the imaging element 100 and image data processed by the image processor 106. Furthermore, the RAM 104 may be used as a work memory by the CPU 101 described below. Any memory may be used as the RAM 104 as long as a speed of access to the memory is sufficient. The ROM 105 stores programs to be executed by the CPU 101. A flash ROM is used as the ROM 105 as an example. However, any memory may be used as long as a speed of access to the memory is sufficient.

The recording unit 108 is a nonvolatile memory or hard disk, for example. The recording unit 108 records still-image data and moving-image data, for example. Although the recording unit 108 is included in the imaging apparatus 1000 in FIG. 1, the recording unit 108 may be a recording medium, such as a nonvolatile memory or hard disk which is attachable from the imaging apparatus 1000 through a connecter. The operation unit 102 is an interface used to transmit information on an operation performed by a user including an imaging instruction and a setting of an imaging condition to the CPU 101. The display unit 103 displays a still image and a moving image obtained as a result of imaging and displays a menu under control of the CPU 101.

The AF calculation unit 107 performs focus detection based on image data output from the imaging element 100. A focus detection process will be described in detail hereinafter. Light which is incident on the imaging apparatus 1000 encounters the imaging element 100 through the first lens group 114, the diaphragm 115, the second lens group 116, the third lens group 117, and the focal plane shutter 109 in this order. The first lens group 114 is held so as to move back and forward along an optical axis. The diaphragm 115 is a mechanism which may be operated so as to control an aperture diameter and which controls an optical amount at a time of imaging. The diaphragm 115 and the second lens group 116 integrally move back and forward along the optical axis and realize a magnification variation function (a zoom function) by being operated in corporation with the back and forward movement of the first lens group 114. The third lens group (focus lens) 117 performs focus control by being moved back and forward along the optical axis.

The focal plane shutter 109 controls an exposure time at a time of still-image recording. Although the exposure time of the imaging element 100 is controlled by the focal plane shutter 109, that is, a mechanical shutter, the present disclosure is not limited to this. For example, the imaging element 100 may have an electronic shutter function and control an exposure time by electronically controlling a charge accumulation time using a control signal. The focus driving circuit 110 controls driving of the focus actuator 112 based on a result of focus detection performed by the AF calculation unit 107 and performs focus control by driving the third lens group 117 back and force along the optical axis. The diaphragm driving circuit 111 controls driving of the diaphragm actuator 113 so as to control the aperture diameter of the diaphragm 115.

Figure 2A:
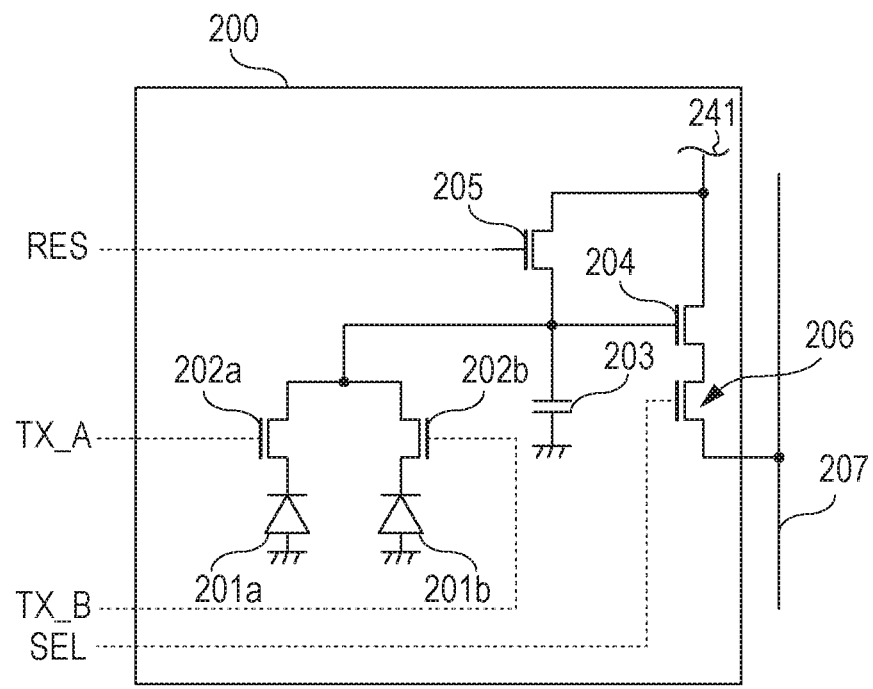
FIGS. 2A and 2B are diagrams illustrating an example of a configuration of a unit pixel according to the first embodiment.

Next, a configuration of the imaging element 100 illustrated in FIG. 1 will be described in detail with reference to FIGS. 2A and 2B and FIG. 3. FIG. 2A is a circuit diagram illustrating a configuration of one of unit pixels 200 included in the imaging element 100. The unit pixel 200 includes photodiodes 201a and 201b, transfer switches 202a and 202b, a floating diffusion region 203, an amplification unit 204, a reset switch 205, and a selection switch 206. Note that each of the switches is configured by a MOS transistor, for example. It is assumed that each of the switches are formed by an N-type MOS transistor, for example, in a description below. However, each of the switches may be a P-type MOS transistor or other switching elements.

As described above, the imaging element 100 according to this embodiment includes the two photodiodes 201a and 201b in each of the unit pixels 200. However, the number of photodiodes included in each of the unit pixels 200 is not limited to two as illustrated in FIG. 2A, and three or more (four, for example) photodiodes may be included in each of the unit pixels 200. In this embodiment, each of the photodiodes 201a and 201b has a function of an imaging pixel in addition to a function of a focus detection pixel as described below.

Figure 2B:
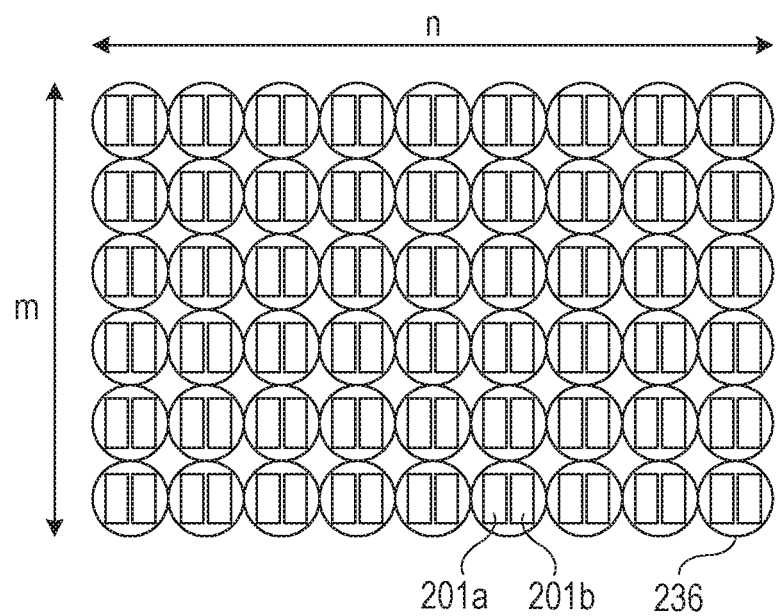

Each of the photodiodes 201a and 201b is a photoelectric conversion unit which receives light transmitted through a micro lens 236 illustrated in FIG. 2B and generates a signal charge in accordance with an amount of the received light by photoelectric conversion. A signal obtained by the photodiode 201a is referred to as an A signal and a signal obtained by the photodiode 201b is referred to as a B signal. As illustrated in FIG. 2B, the imaging element 100 includes the plurality of unit pixels 200 arranged in a matrix (m rows by n columns).

The transfer switch 202a is connected between the photodiode 201a and the floating diffusion region 203, and the transfer switch 202b is connected between the photodiode 201b and the floating diffusion region 203. The transfer switches 202a and 202b are elements which transfer charge generated in the photodiodes 201a and 201b, respectively, to the common floating diffusion region 203. The transfer switches 202a and 202b are controlled by control signals TX_A and TX_B, respectively.

The floating diffusion region 203 is a charge/voltage conversion unit which temporarily stores charge transmitted from the photodiodes 201a and 201b and converts the stored charge into a voltage signal. The amplification unit 204 is a source-follower MOS transistor. The amplification unit 204 has a gate connected to the floating diffusion region 203 and a drain connected to a common power source 241 which supplies a power source voltage VDD. The amplification unit 204 amplifies a voltage signal based on the charge stored in the floating diffusion region 203 so as to obtain an image signal to be output.

The reset switch 205 is connected between the floating diffusion region 203 and the common power source 241. The reset switch 205 is controlled by a control signal RES and resets a potential of the floating diffusion region 203 to the power source potential VDD. The selection switch 206 is connected between a source of the amplification unit 204 and a column signal line 207. The selection switch 206 is controlled by a control signal SEL and outputs an image signal amplified by the amplification unit 204 to the column signal line 207.

Figure 3:
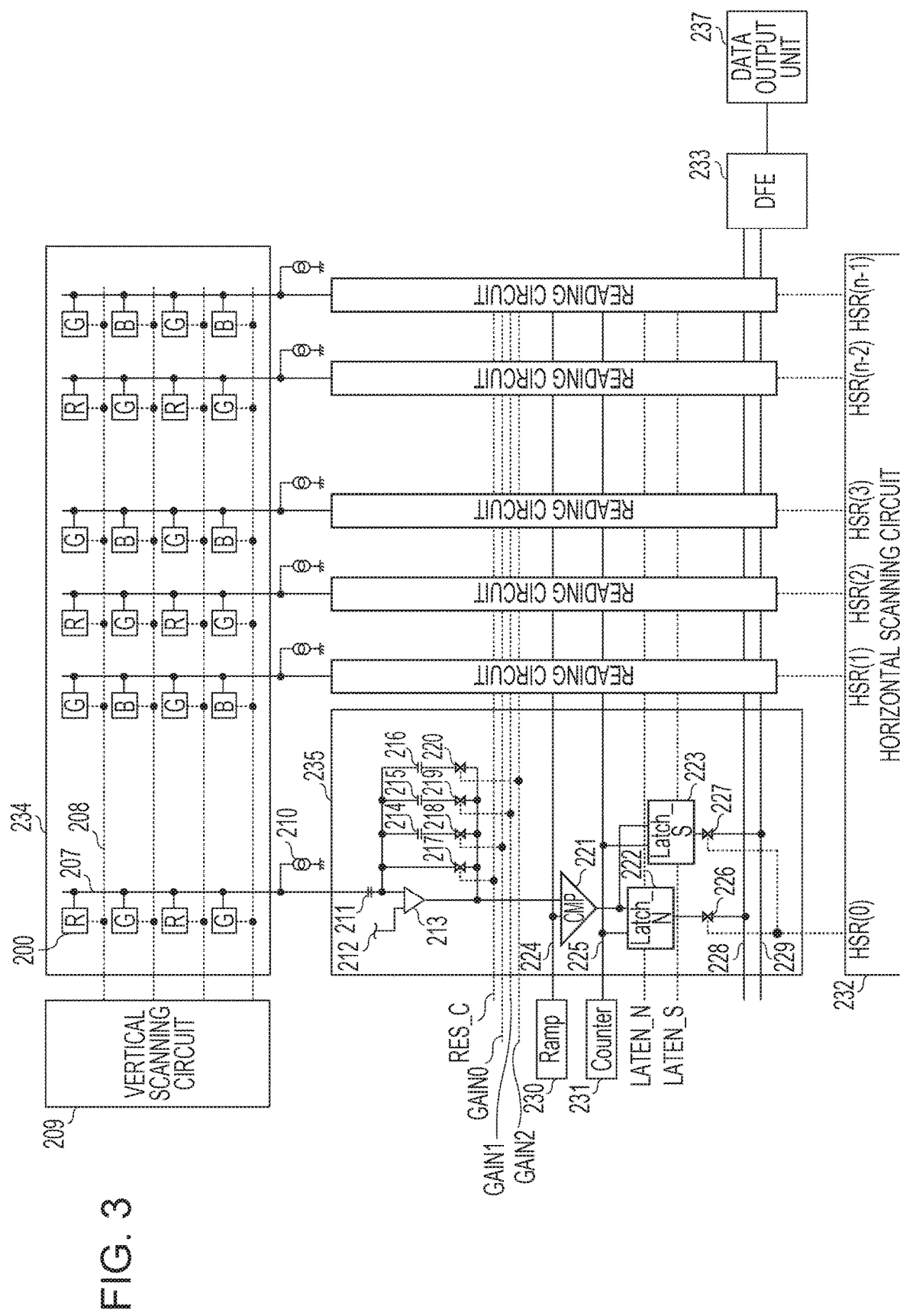
FIG. 3 is a diagram illustrating an example of a configuration of an imaging element according to the first embodiment.

FIG. 3 is a diagram illustrating a configuration of the imaging element 100. The imaging element 100 includes a pixel region 234, a vertical scanning circuit 209, current source loads 210, reading circuits 235, common output lines 228 and 229, a horizontal scanning circuit 232, a DFE 233, and a data output unit 237. The pixel region 234 includes the plurality of unit pixels 200 arranged in a matrix. Although a matrix of n pixels in a horizontal direction by four pixels in a vertical direction is illustrated for simplicity of description in FIG. 3, the number of rows and the number of columns of the unit pixels 200 are arbitrarily determined. Each of the unit pixels 200 includes one of color filters of different colors. In the example of FIG. 3, colors of the color filters are red (R), green (G), and blue (B). The unit pixels 200 are arranged in accordance with Bayer array. The imaging element 100 according to this embodiment has an optical black (OB) region which is blocked by a light shielding layer in a portion of the pixel region 234. The OB region has a number of the unit pixels 200 serving as light shielding pixels.

The vertical scanning circuit 209 outputs a control signal to the unit pixels 200 in individual rows through driving signal lines 208 disposed for individual rows of the unit pixels 200. Note that, although the driving signal lines 208 are disposed for the individual rows in FIG. 3 for simplicity of the description, a plurality of driving signal lines are connected to each of the rows in practice. The unit pixels 200 in the same column are connected to a corresponding one of the column signal lines 207 disposed for individual columns. The unit pixels 200 in the same column output signals to a corresponding one of the reading circuits 235 through a corresponding one of the column signal lines 207. The reading circuits 235 in the individual columns process signals output from the corresponding column signal lines 207 in the individual columns. The current source loads 210 are individually connected to the column signal lines 207 in the columns.

The horizontal scanning circuit 232 successively selects one of the columns from which signals are output from the reading circuits 235 by outputting control signals HSR(0) to HSR(n−1). The selected one of the reading circuits 235 in the selected one of the columns outputs a processed signal to the DFE 233 through the common output lines 228 and 229.

Next, a configuration of the reading circuits 235 will be described in detail. Each of the reading circuits 235 includes a clamp capacitor 211, feedback capacitors 214 to 216, an operational amplifier 213, a reference voltage source 212, and switches 217 to 220. Each of the reading circuits 235 further includes a comparator 221, a latch (Latch_N) 222, a latch (Latch_S) 223, and switches 226 and 227.

The signal supplied from the column signal line 207 to the reading circuit 235 is input to an inverting input terminal of the operational amplifier 213 through the clamp capacitor 211. A reference voltage Vref is supplied from the reference voltage source 212 to a non-inverting input terminal of the operational amplifier 213. The feedback capacitors 214 to 216 are connected between the inverting input terminal and an output terminal of the operational amplifier 213. The switch 217 is also connected between the inverting input terminal and the output terminal of the operational amplifier 213 and may short out opposite ends of the feedback capacitors 214 to 216. The switch 217 is controlled by a control signal RES_C. The switches 218 to 220 are controlled by control signals GAIN0 to GAIN2, respectively.

A signal output from the operational amplifier 213 and a ramp signal 224 output from a ramp signal generator 230 are supplied to the comparator 221. The latch 222 is a storage element which stores a noise level (an N signal). The latch 223 is a storage element which stores levels (S signals) of an A signal and an AB signal (an addition signal) obtained by adding the A signal and a B signal to each other. The latches 222 and 223 receive a signal supplied from an output terminal of the comparator 221 and a counter value 225 output from a counter 231 and are controlled by control signals LATEN_N and LATEN_S, respectively. Output terminals of the latches 222 and 223 are connected to the common output lines 228 and 229 through the switches 226 and 227, respectively. The common output lines 228 and 229 are connected to the DFE 233.

The switches 226 and 227 are controlled by a control signal HSR(h) supplied from the horizontal scanning circuit 232. Here, "h" denotes a column number of the reading circuit 235 connected to a control signal line. Signals held in the latches 222 and 223 are output to the DFE 233 through the common output lines 228 and 229, respectively. The DFE 233 performs a correction process described below. Thereafter, the data output unit 237 externally outputs data supplied from the DFE 233. This operation is referred to as horizontal transfer.

The imaging element 100 of this embodiment performs an operation of individually reading the A and B signals (division readout) and an operation of reading the signal (the AB signal) obtained by adding the A and B signals to each other (totaling readout). The A and B signals read by the division readout are to be used in the focus detection and image generation. The AB signal read by the totaling readout is to be used in the image generation.

Figure 4:
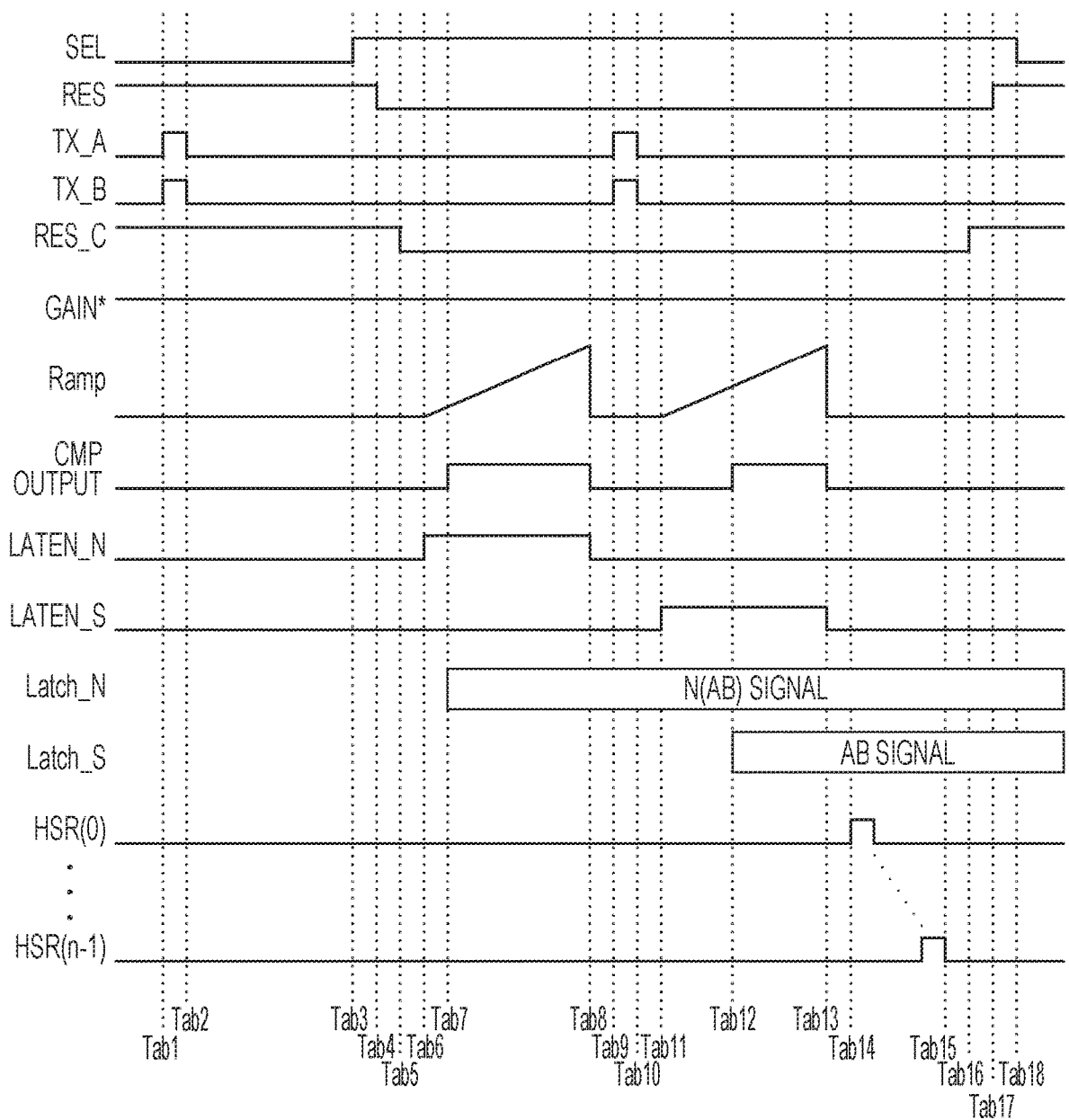
FIG. 4 is a timing chart illustrating a method for driving the imaging element.
Figure 5:
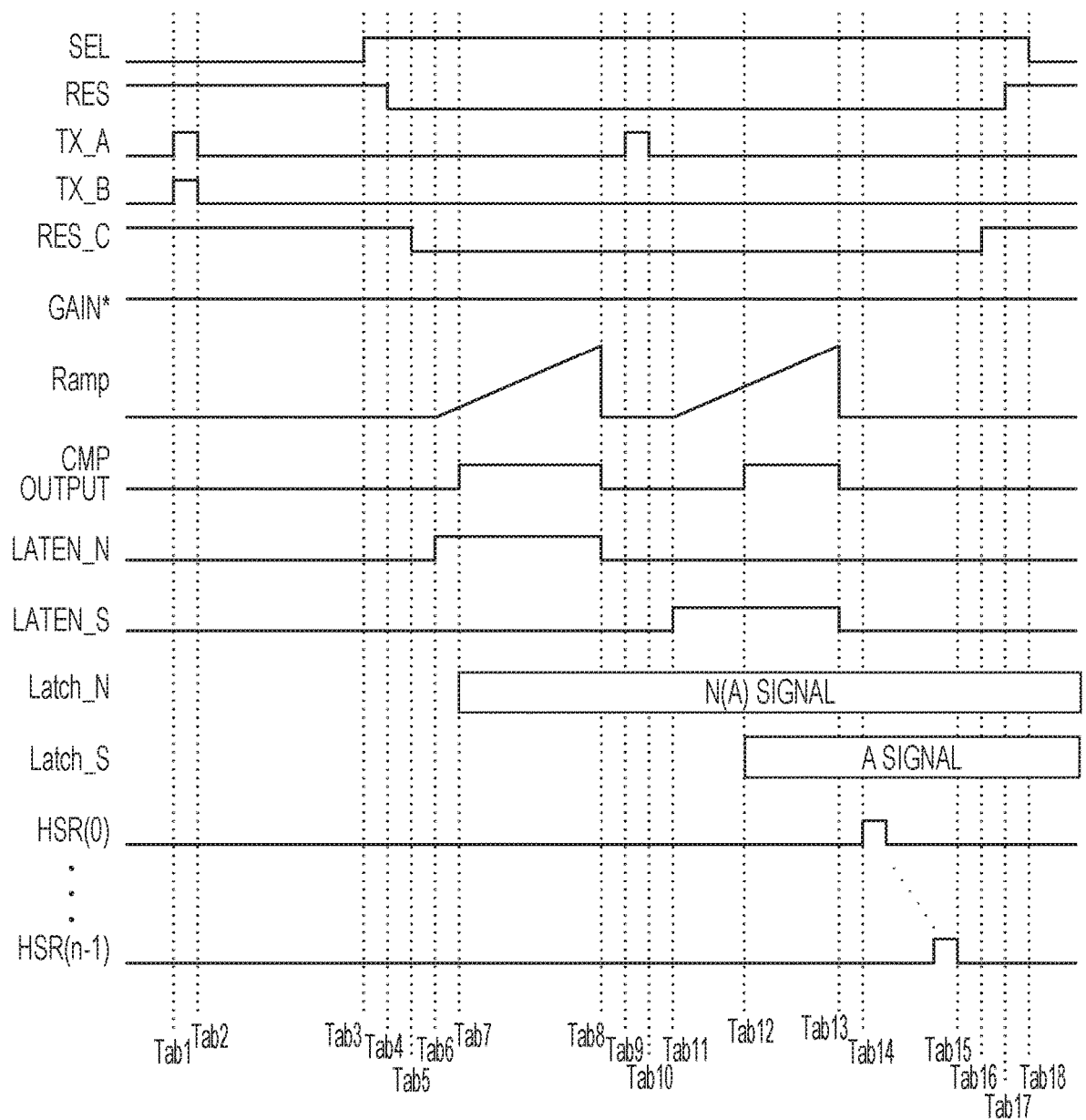
FIG. 5 is a timing chart illustrating a method for driving the imaging element.
Figure 6:
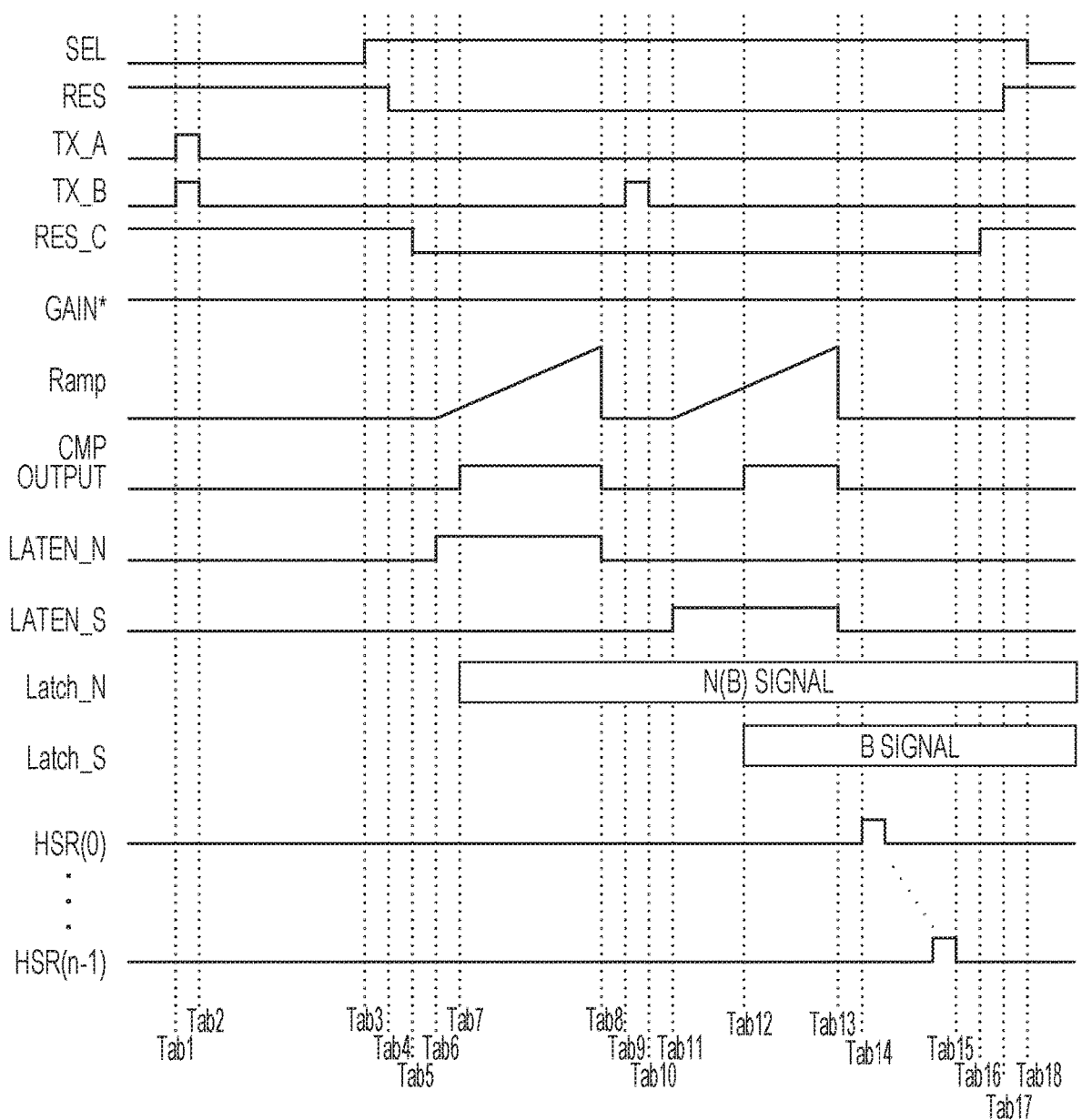
FIG. 6 is a timing chart illustrating a method for driving the imaging element.

FIGS. 4 to 6 are timing charts of reading operations performed by the imaging element 100. Hereinafter, operations of reading image signals for one row will be described with reference to FIGS. 4 to 6. Note that the switches are turned on when control signals are in a high level and turned off when the control signals are in a low level.

FIG. 4 is a timing chart of an operation of reading the AB signal. At a time point Tab1, the control signals TX_A and TX_B are brought into a high level, and therefore, the transfer switches 202a 202b are turned on. Here, the control signal RES is in a high level, and charge accumulated in the photodiodes 201a and 201b is transferred to the common power source 241 through the transfer switches 202a and 202b and the reset switch 205. The photodiodes 201a and 201b and the floating diffusion region 203 are reset. At a time point Tab2, the control signals TX_A and TX_B are brought into a low level, the transfer switches 202a and 202b are turned off, and the photodiodes 201a and 201b start accumulation of charge by photoelectric conversion.

At a time point Tab3 when the charge has been accumulated for a predetermined period of time, the control signal SEL of the selection switch 206 is brought into a high level, the selection switch 206 is turned on, and a source of the amplification unit 204 is connected to a corresponding one of the column signal lines 207. At a time point Tab4, the control signal RES supplied to the reset switch 205 is brought into a low level and reset of the floating diffusion region 203 is cancelled. Here, a potential of a reset signal level corresponding to a potential of the floating diffusion region 203 is read to a corresponding one of the column signal lines 207 through the amplification unit 204 and further input to a corresponding one of the reading circuits 235.

Thereafter, at a time point Tab5, the control signal RES_C is brought into a low level from a high level, the switch 217 is turned off, and a voltage based on a difference between the reset signal level read out to a corresponding one of the column signal lines 207 and the reference voltage Vref is output from the operational amplifier 213. In the imaging element 100, the CPU 101 brings one of the control signals GAIN0 to GAIN2 into a high level based on an ISO speed set by the operation unit 102 in advance. The imaging apparatus 1000 of this embodiment has ISO speeds of 100, 200, and 400. The control signals GAIN0 to GAIN2 are brought into a high level relative to the ISO speeds 100 to 400, respectively. Accordingly, the corresponding switches 218 and 219 are turned on. The operational amplifier 213 amplifies an input voltage using an inverting gain determined by a rate of the clamp capacitor 211 or the feedback capacitors 214 to 216 and outputs the amplified voltage. The operational amplifier 213 amplifies a random noise component generated in a circuit before the operational amplifier 213 is reached, and amounts of random noise of signals output in the ISO speeds of 100, 200, and 400 are different from one another.

Subsequently, at a time point Tab6, the ramp signal generator 230 starts output of a ramp signal Ramp having a signal level which varies in proportion to an elapsed time. Simultaneously, the counter 231 starts count-up in a reset state, and the control signal LATEN_N is brought into a high level. The comparator 221 compares the signal output from the operational amplifier 213 with the ramp signal Ramp output from the ramp signal generator 230. A signal level of the ramp signal Ramp becomes large with time. At a time point Tab7 when the signal level of the ramp signal Ramp exceeds a value of the signal output from the operational amplifier 213, the comparator 221 inverts a signal to be output to the latch (Latch_N) 222 from a low level to a high level. When the signal output from the comparator 221 is inverted from the low level to the high level in a state in which the control signal LATEN_N is in a high level, the latch (Latch_N) 222 stores the counter value 225 output from the counter 231 at this time. The stored counter value corresponds to a digital N signal level. Thereafter, at a time point Tab8, the variation of the ramp signal is terminated and the control signal LATEN_N is brought into a low level.

At a time point Tab9, the control signals TX_A and TX_B are brought into a high level, the transfer switches 202a and 202b are turned on, and transfer of charge in the photodiodes 201a and 201b to the floating diffusion region 203 is simultaneously started. Thereafter, at a time point Tab10, the control signals TX_A and TX_B are brought into a low level, and the transfer switches 202a 202b are turned off. By this operation, the charge accumulated in the photodiodes 201a and 201b is transferred to the floating diffusion region 203. Then a voltage corresponding to the change of the charge is output to a corresponding one of the reading circuits 235 through the amplification unit 204 and a corresponding one of the column signal lines 207. The operational amplifier 213 outputs a voltage based on a difference between the AB signal level read by the corresponding one of the column signal lines 207 and the reference voltage Vref. The operational amplifier 213 amplifies an input voltage using an inverting gain determined by a rate of the clamp capacitor 211 or the feedback capacitors 214 to 216 and outputs the amplified voltage.

Subsequently, at a time point Tab11, the ramp signal generator 230 starts output of the ramp signal Ramp. Simultaneously, the counter 231 starts count-up in a reset state, and the control signal LATEN_S is brought into a high level. The comparator 221 compares the signal output from the operational amplifier 213 with the ramp signal Ramp output from the ramp signal generator 230. At a time point Tab12 when a signal level of the ramp signal Ramp exceeds a value of the signal output from the operational amplifier 213, the comparator 221 inverts a signal to be output to the latch (Latch_S) 223 from a low level to a high level. When the signal output from the comparator 221 is inverted from the low level to the high level in a state in which the control signal LATEN_S is in the high level, the latch (Latch_S) 223 stores the counter value 225 output from the counter 231 at this time. The stored counter value corresponds to a digital AB signal level. Thereafter, at a time point Tab13, the variation of the ramp signal Ramp is terminated and the control signal LATEN_S is brought into a low level.

Thereafter, in a period from a time point Tab14 to a time point Tab15, the control signals HSR(h) output from the horizontal scanning circuit 232 are successively brought into a high level from a low level and again brought into a low level. Accordingly, the switches 226 and 227 are brought into an On state from an Off state, and again brought into an Off state. The N signal data and the AB signal data held by the latch (Latch_N) 222 and the latch (Latch_S) 223 in the individual columns are read to the common output lines 228 and 229, respectively, and output to the DFE 233. The DFE 233 calculates a difference between the AB signal data and the N signal data for each column (an image signal Pab) before performing a correction process described below. Thereafter, the data output unit 237 externally outputs the data supplied from the DFE 233.

Thereafter, at a time point Tab 16, the control signal RES_C is brought into a high level and the switch 217 is turned on. At a time point Tab 17, the control signal RES is brought into a high level and the switch 205 is turned on. At a time point Tab18, the control signal SEL is brought into a low level, the selection switch 206 is turned off, and an operation of reading the AB signals for one row is completed.

FIG. 5 is a timing chart of an operation of reading the A signal. An operation performed in a period from a time point Ta1 to a time point Ta8 is the same as that performed in a period from the time point Tab1 to the time point Tab8 in FIG. 4, and therefore, a description thereof is omitted. At a time point Ta9, the control signals TX_A is brought into a high level, the transfer switch 202a is turned on, and transfer of charge in the photodiode 201a to the floating diffusion region 203 is started. Thereafter, at a time point Ta10, the control signal TX_A is brought into a low level and the transfer switch 202a is turned off. By this operation, the charge accumulated in the photodiode 201a is transferred to the floating diffusion region 203. Then a voltage corresponding to the change of the charge is output to a corresponding one of the reading circuits 235 through the amplification unit 204 and a corresponding one of the column signal lines 207. The operational amplifier 213 outputs a voltage based on a difference between the A signal level read by a corresponding one of the column signal lines 207 and the reference voltage Vref. The operational amplifier 213 amplifies an input voltage using an inverting gain determined by a rate of the clamp capacitor 211 or the feedback capacitors 214 to 216 and outputs the amplified voltage.

Subsequently, at a time point Ta11, the ramp signal generator 230 starts output of the ramp signal Ramp. Simultaneously, the counter 231 starts count-up in a reset state, and the control signal LATEN_S is brought into a high level. The comparator 221 compares the signal output from the operational amplifier 213 with the ramp signal Ramp output from the ramp signal generator 230. At a time point Tab12 when the signal level of the ramp signal Ramp exceeds a value of the signal output from the operational amplifier 213, the comparator 221 inverts a signal to be output to the latch (Latch_S) 223 from a low level to a high level. When the signal output from the comparator 221 is inverted from the low level to the high level in a state in which the control signal LATEN_S is in a high level, the latch (Latch_S) 223 stores the counter value 225 output from the counter 231 at this time. The stored counter value corresponds to a digital A signal level. Thereafter, at a time point Ta13, the variation of the ramp signal Ramp is terminated and the control signal LATEN_S is brought into a low level.

Thereafter, in a period from a time point Ta14 to a time point Ta15, the control signals HSR(h) output from the horizontal scanning circuit 232 are successively brought into a high level from a low level and again brought into a low level. Accordingly, the switches 226 and 227 are brought into an On state from an Off state, and again brought into an OFF state. The N signal data and the A signal data held by the latch (Latch_N) 222 and the latch (Latch_S) 223 in each column are read to the common output lines 228 and 229, respectively, and output to the DFE 233. The DFE 233 calculates a difference between the A signal data and the N signal data for each column (an image signal Pa) before performing a correction process described below. Thereafter, the data output unit 237 externally outputs the data supplied from the DFE 233.

Thereafter, at a time point Ta 16, the control signal RES_C is brought into a high level and the switch 217 is turned on. Thereafter, at a time point Ta 17, the control signal RES is brought into a high level and the reset switch 205 is turned on. At a time point Ta18, the control signal SEL is brought into a low level, the selection switch 206 is turned off, and an operation of reading the A signal for one row is completed.

FIG. 6 is a timing chart of an operation of reading the B signal. An operation performed in a period from a time point Tb1 to a time point Tb8 is the same as that performed in the period from the time point Tab1 to the time point Tab8 in FIG. 4, and therefore, a description thereof is omitted. At a time point Tb9, the control signals TX_B is brought into a high level, the transfer switch 202b is turned on, and transfer of charge in the photodiode 201b to the floating diffusion region 203 is started. Thereafter, at a time point Tb10, the control signal TX_B is brought into a low level and the transfer switch 202b is turned off. By this operation, the charge accumulated in the photodiode 201b is transferred to the floating diffusion region 203. Then a voltage corresponding to the change of the charge is output to a corresponding one of the reading circuits 235 through the amplification unit 204 and a corresponding one of the column signal lines 207. The operational amplifier 213 outputs a voltage based on a difference between a B signal level read by the corresponding one of the column signal lines 207 and the reference voltage Vref. The operational amplifier 213 amplifies an input voltage using an inverting gain determined by a rate of the clamp capacitor 211 or the feedback capacitors 214 to 216 and outputs the amplified voltage.

Subsequently, at a time point Tb11, the ramp signal generator 230 starts output of the ramp signal Ramp. Simultaneously, the counter 231 starts count-up in a reset state, and the control signal LATEN_S is brought into a high level. The comparator 221 compares the signal output from the operational amplifier 213 with the ramp signal Ramp output from the ramp signal generator 230. At a time point Tb12 when the signal level of the ramp signal Ramp exceeds a value of the signal output from the operational amplifier 213, the comparator 221 inverts a signal to be output to the latch (Latch_S) 223 from a low level to a high level. When the signal output from the comparator 221 is inverted from the low level to the high level in a state in which the control signal LATEN_S is in a high level, the latch (Latch_S) 223 stores the counter value 225 output from the counter 231 at this time. The stored counter value corresponds to a digital B signal level. Thereafter, at a time point Tb13, the variation of the ramp signal Ramp is terminated and the control signal LATEN_S is brought into a low level.

Thereafter, in a period from a time point Tb14 to Tb15, the control signals HSR(h) output from the horizontal scanning circuit 232 are successively brought into a high level from a low level and again brought into a low level. Accordingly, the switches 226 and 227 are brought into an On state from an Off state, and again brought into an OFF state. The N signal data and the B signal data held by the latch (Latch_N) 222 and the latch (Latch_S) 223 in each column are read to the common output lines 228 and 229, respectively, and output to the DFE 233. The DFE 233 calculates a difference between the B signal data and the N signal data for each column (an image signal Pb) before performing a correction process described below. Thereafter, the data output unit 237 externally outputs the data supplied from the DFE 233.

Thereafter, at a time point Tb 16, the control signal RES_C is brought into a high level and the switch 217 is turned on. At a time point Tb 17, the control signal RES is brought into a high level and the switch 205 is turned on. At a time point Tb18, the control signal SEL is brought into a low level, the selection switch 206 is turned off, and an operation of reading the B signal for one row is completed.

FIG. 7 is a diagram illustrating the pixel region 234 of the imaging element 100. The pixel region 234 includes a vertical OB region (a first light shielding region) 711 on an upper portion in the pixel region 234, a horizontal OB region (a second light shielding region) 712 on a left portion in the pixel region 234, and an opening region 713 in the other portion in the pixel region 234. The vertical OB region 711 includes rows different from those of the opening region 713. The horizontal OB region 712 includes the rows same as those of the opening region 713. The vertical OB region 711 and the horizontal OB region 712 are subjected to light shielding. The unit pixels 200 correspond to the vertical OB region 711 and the horizontal OB region 712 are OB pixels. The opening region 713 is not subjected to the light shielding. The pixel region 234 includes rows corresponding to a region Region_i from which image signals Pa of the photodiodes 201a and image signals Pb of the photodiodes 201b are read and a region Region_c from which mixed image signals Pab of the photodiodes 201a and 201b are read. The region Region_c is in a first reading mode. The region Region_i is in a second reading mode. The vertical scanning circuit 209 is a reading controller and reads the image signals Pab obtained by mixing signals of the photodiodes 201a and 201b in the first reading mode in the rows corresponding to the region Region_c. Furthermore, The vertical scanning circuit 209 reads the image signals Pa of the photodiodes 201a and the image signals Pb of the photodiodes 201b in the second reading mode in the rows corresponding to the region Region_i. Each of the vertical OB region 711, the horizontal OB region 712, and the opening region 713 has the rows corresponding to the region Region_i and the rows corresponding to the region Region_c. In the region Region_c, the mixed image signals Pab obtained by mixing the signals from the photodiodes 201a and 201b are read by the reading operation illustrated in FIG. 4. In the region Region_i, after the reading operation illustrated in FIG. 5 is performed, the reading operation illustrated in FIG. 6 is performed on the same row following the reading operation of FIG. 5 so that the image signals Pa and Pb in the same pixels are obtained. An arrangement position of the division readout rows may be changed for each frame in accordance with a setting of a focus measuring frame 714 illustrated in FIG. 7 or a movement of the object.

Furthermore, the imaging apparatus 1000 has a still-image mode and a moving-image mode (a live-view imaging mode). In the still-image mode, the imaging apparatus 1000 reads pixel data corresponding to all the rows of the imaging element 100. In the moving-image mode, the imaging apparatus 1000 reads pixel data for one row per three rows, that is, the number of rows read in the moving-image mode is smaller than that in the still-image mode. However, configurations and reading methods of the still-image mode and the moving-image mode are not limited to these.

Next, a process performed on image data output by the imaging element 100 will be described. FIGS. 8A and 8B and FIGS. 9A and 9B are diagrams illustrating a concept of the focus detection employing the phase difference method. First, the relationship between focus and a phase difference in the imaging element 100 will be described with reference to FIGS. 8A and 8B.

Figure 8A:
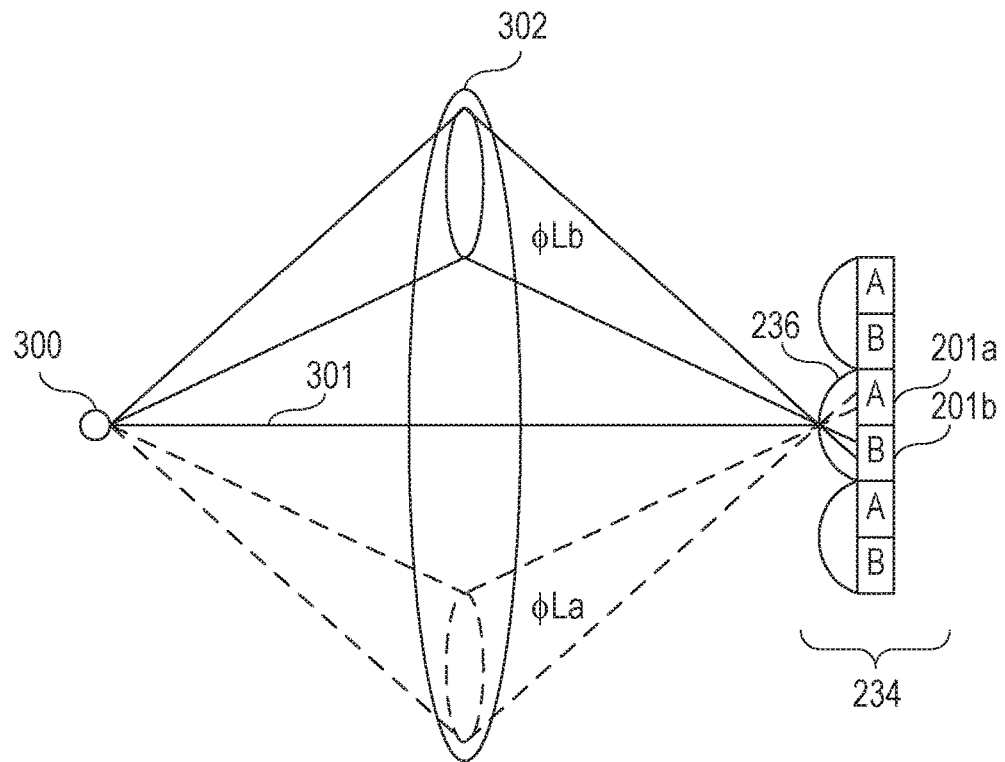
FIGS. 8A and 8B are diagrams illustrating a concept of focus detection employing a phase difference method.
Figure 8B:
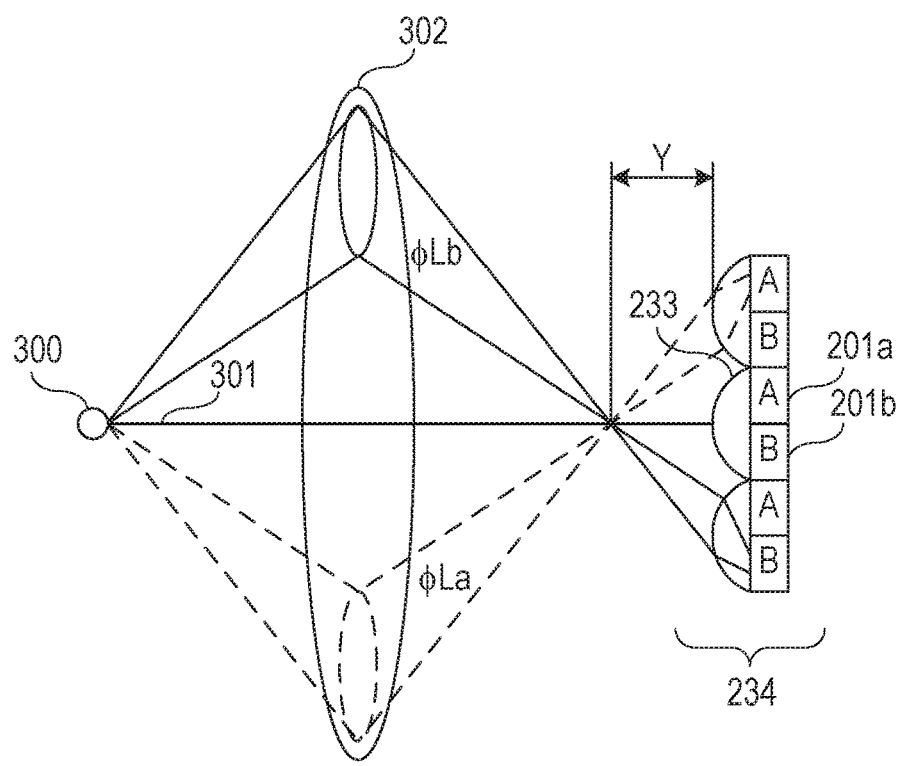

In FIG. 8A, the positional relationship among an imaging lens 302, an object 300, an optical axis 301, and the pixel region 234 and light beams at a time of focusing (in a focal position) are illustrated. In FIG. 8B, the positional relationship and the light beams at a time of defocusing are illustrated. In FIGS. 8A and 8B, the pixel region 234 in FIG. 1 is viewed from a cross-sectional direction. Each of the unit pixels 200 in the pixel region 234 includes the single micro lens 236. As described above, the photodiodes 201a and 201b receive light which is transmitted through the same micro lens 236. Different images having a phase difference due to different configurations described below are input to the photodiodes 201a and 201b. Here, the photodiode 201a is an A image photoelectric conversion unit and the photodiode 201b is a B image photoelectric conversion unit. In FIGS. 8A and 8B, the A image photoelectric conversion unit 201a is denoted by "A" and the B image photoelectric conversion unit 201b is denoted by "B". Note that, although the two photodiodes 201a and 201b are arranged for the single micro lens 236 in this embodiment, the present disclosure is not limited to this. Any arrangement may be employed as long as a plurality of photodiodes are arranged in a vertical direction or a horizontal direction relative to the single micro lens 236.

The imaging lens 302 is equivalent to a single lens integrally including the first lens group 114, the second lens group 116, and the third lens group 117 illustrated in FIG. 1. Light emitted from an object 300 is transmitted through the various regions in the imaging lens 302 with the optical axis 301 at the center and forms an image on the pixel region 234 of the imaging element 100. Note that a position of an exit pupil and a center position of the imaging lens 302 are the same.

With this configuration, a view of the imaging lens 302 from the A image photoelectric conversion unit 201a and a view of the imaging lens 302 from the B image photoelectric conversion unit 201b are equivalent to symmetric division of the pupil of the imaging lens 302. In other words, a light beam from the imaging lens 302 is divided into two light beams ΦLa and ΦLb, that is, pupil division is configured. The divided light beams (first and second light beams ΦLa and ΦLb) are incident on the A image photoelectric conversion unit 201a and the B image photoelectric conversion unit 201b. In this way, the A image photoelectric conversion unit 201a and the B image photoelectric conversion unit 201b receive the light which passes different pupil regions in the exit pupil of the imaging lens 302 and perform photoelectric conversion on the light so as to function as focus detection pixels. Furthermore, the A image photoelectric conversion unit 201a and the B image photoelectric conversion unit 201b may function as imaging pixels by adding signals of the A image photoelectric conversion unit 201a and the B image photoelectric conversion unit 201b to each other.

A light beam emitted from a specific point on the object 300 is divided into the light beam ΦLa which is incident on the A image photoelectric conversion unit 201a through a division pupil corresponding to the A image photoelectric conversion unit 201a and the light beam ΦLb which is incident on the B image photoelectric conversion unit 201b through a division pupil corresponding to the B image photoelectric conversion unit 201b. Since the two light beams ΦLa and ΦLb are incident from the same point on the object 300, the two light beams ΦLa and ΦLb reach the same point on the imaging element 100 through the same micro lens 236 as illustrated in FIG. 8A when the imaging lens 302 is in focus. Therefore, image signals obtained by the A image photoelectric conversion unit 201a and the B image photoelectric conversion unit 201b coincide with each other.

However, as illustrated in FIG. 8B, when the imaging lens 302 is defocused by Y in a direction of the optical axis 301, positions in which the light beams ΦLa and ΦLb reach shift in the vertical direction relative to the optical axis 301 by changes of incident angles of the light beams ΦLa and ΦLv to the micro lens 236. Accordingly, image signals obtained from the A image photoelectric conversion unit 201a and the B image photoelectric conversion unit 201b have a phase difference. The A image photoelectric conversion unit 201a and the B image photoelectric conversion unit 201b (that is, the focus detection pixels) individually generate signals for focus detection by performing photoelectric conversion on two object images (an A image and a B image) which have a phase difference. The signals are output outside the imaging element 100 so as to be used for an AF operation. The imaging element 100 performs the division readout and the totaling readout as described above. The A image (an A signal) and the B image (a B signal) read by the division readout are supplied to the AF calculation unit 107.

Note that, although the plurality of photoelectric conversion units 201a and 201b are arranged for the single micro lens 236 and the light beams ΦLa and ΦLb obtained by the pupil division are incident on the photoelectric conversion units 201a and 201b, respectively, in this embodiment, the configuration is not limited to this. For example, as a configuration of focus detection pixels, a single photodiode may be disposed below the micro lens 236 and the pupil division may be performed by shielding light in a horizontal direction or a vertical direction using a light shielding layer. Furthermore, an A image signal and a B image signal may be obtained from the focus detection pixels discretely arranged.

Figure 9A:
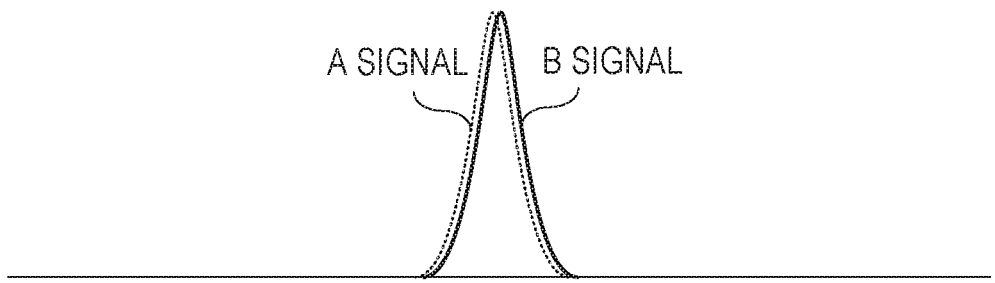
FIGS. 9A and 9B are diagrams illustrating a concept of focus detection of the phase difference method.
Figure 9B:
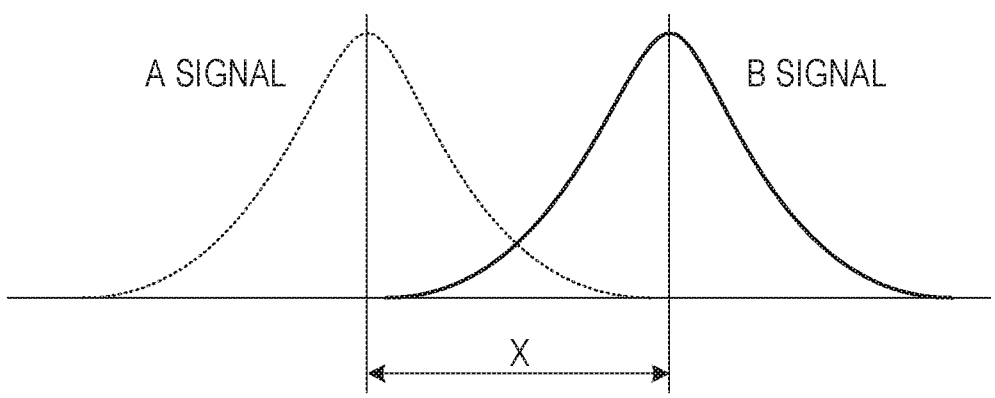

The AF calculation unit 107 performs a focus detection operation using the input A and B signals. FIG. 9A is a graph illustrating intensity distribution of the A and B signals in the focusing state illustrated in FIG. 8A. An axis of abscissae denotes a pixel position and an axis of ordinates denotes intensity of the signals. In the focusing state, the A and B signals coincide with each other. FIG. 9B is a graph illustrating intensity distribution of the A and B signals in the defocusing state illustrated in FIG. 8B. In this case, the A and B signals have a phase difference due to the reason described above and peak positions of the intensity are shifted from each other by a shift amount X. The AF calculation unit 107 calculates the shift amounts X for individual frames and a predetermined calculation process is performed using the shift amounts X so as to calculate a defocusing amount, that is, a shift amount Y illustrated in FIG. 8B. The AF calculation unit 107 transfers the calculated shift amount Y to the focus driving circuit 110. The focus driving circuit 110 calculates an amount of movement of the third lens group 117 based on the shift amount Y supplied from the AF calculation unit 107 and outputs a driving signal to the focus actuator 112. The third lens group 117 driven by the focus actuator 112 moves to a focusing position so that a focusing state is realized.

Figure 10A:
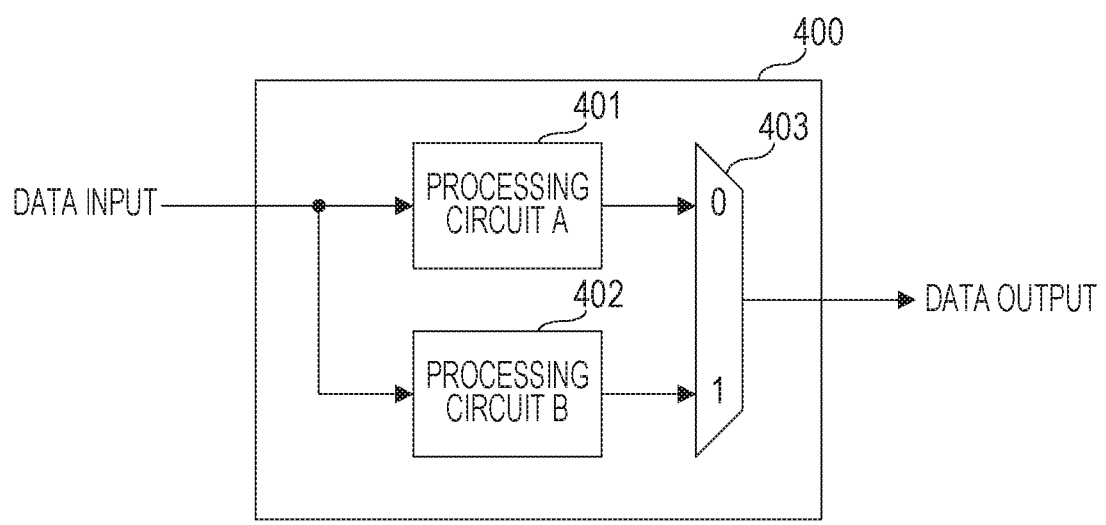
FIGS. 10A to 10C are diagrams illustrating an example of a configuration of an OB clamp process according to the first embodiment.

Next, a process performed by the DFE 233 will be described. In this embodiment, the DFE 233 includes an OB clamp processor 400 illustrated in FIG. 10A. An example of a configuration of the OB clamp processor 400 will be described with reference to FIGS. 10A to 10C. The OB clamp processor 400 supplies the image signals Pab, Pa, and Pb described above. As illustrated in FIG. 10A, the OB clamp processor 400 includes a processing circuit (A) 401 and a processing circuit (B) 402 and corrects signals output from the unit pixels 200 corresponding to the opening region 713 based on signals output from the unit pixels 200 corresponding to the vertical OB region 711 and the horizontal OB region 712. The processing circuit (A) 401 and the processing circuit (B) 402 are OB clamp processing circuits. Signals output from the processing circuit (A) 401 and the processing circuit (B) 402 are supplied to a selector 403. The selector 403 selects data to be output from the OB clamp processor 400.

Figure 10B:
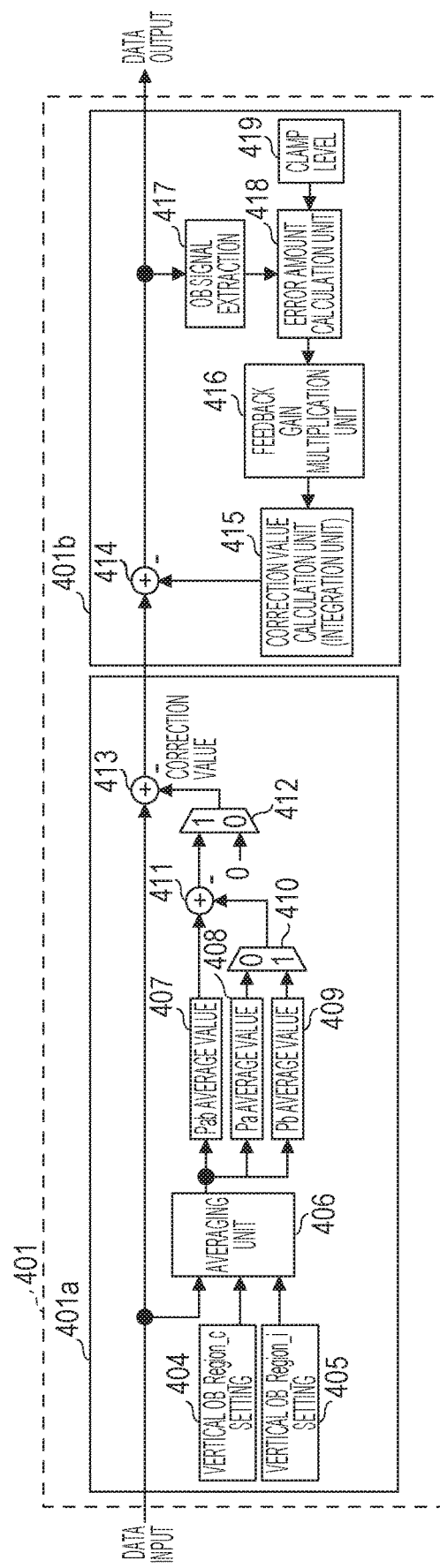

FIG. 10B is a diagram illustrating an example of a configuration of the processing circuit (A) 401. Data input to the processing circuit (A) 401 is processed by a processing circuit 401a before being processed by a processing circuit 401b and is output.

First, a configuration of the processing circuit 401a will be described. An averaging circuit 406 receives data input to the processing circuit (A) 401 and obtains an average value of data of the region Region_c and the region Region_i included in the vertical OB region 711 set by a vertical OB_Region_c setting unit 404 and a vertical OB_Region_i setting unit 405, respectively. The region Region_c in the vertical OB region 711 illustrated in FIG. 7 is set to the vertical OB_Region_c setting unit 404. The averaging circuit 406 calculates an average value after integrating the image signals Pab read from the region Region_c and stores the average value in a Pab average value unit 407. The region Region_i in the vertical OB region 711 illustrated in FIG. 7 is set to the vertical OB_Region_i setting unit 405. The averaging circuit 406 calculates an average value after integrating the image signals Pa or Pb read from the region Region_i and stores the average value in a Pa average value unit 408 or a Pb average value unit 409. The average value in the Pa average value unit 408 or the Pb average value unit 409 is supplied to a selector 410. The selector 410 selects an input terminal 0, that is, the average value in the Pa average value unit 408, when data input to the processing circuit (A) 401 is the image signal Pa whereas the selector 410 selects an input terminal 1, that is, the average value in the Pb average value unit 409, when the input data is the image signal Pb.

A subtracter 411 subtracts an output value of the selector 410 from the average value of the Pab average value unit 407. By this process, the subtracter 411 calculates a difference between dark levels of the image signals Pab and Pa or a difference between dark levels of the image signals Pab and Pb. A value output from the subtracter 411 is supplied to a selector 412. The selector 412 outputs a value of an input terminal 1, that is, a value output from the subtracter 411, to a subtracter 413 as a correction value when the processing circuit (A) 401 is set in an On state and data of the region Region_i in the regions other than the vertical OB region 711 is input. When the image signals Pa are input, a difference between the average value of the image signals Pab and the average value of the image signals Pa serves as a correction value. When the image signal Pb is input, a difference between the average value of the image signals Pab and the average value of the image signals Pb serves as a correction value. The selector 412 outputs an input terminal 0, that is, 0 value, to the subtracter 413 when the processing circuit (A) 401 is set in an Off state or when data of the region Region_c in the regions other than the vertical OB region 711 is input. The subtracter 413 subtracts the correction value output from the selector 412 from the data input to the processing circuit (A) 401 so as to perform an offset correction process. By this process, the processing circuit 401a corrects a difference between an offset obtained when the division readout is performed and an offset obtained when the totaling readout is performed.

Thereafter, the data output from the processing circuit 401a is supplied to the processing circuit 401b. An OB signal extraction unit 417 extracts signals of the OB pixels when the data of the OB regions 711 and 712 is input. The OB signal extraction unit 417 may supply the OB pixels to be used in the OB clamp process to a processing circuit disposed after an error amount calculation unit 418 one by one or obtain an average value of the plurality of OB pixels. The error amount calculation unit 418 obtains a difference between a correction target value (a clamp level) 419 of the dark level set in advance and a current OB output level output from the OB signal extraction unit 417 so as to calculate an error amount. The calculated error amount is supplied to a feedback gain multiplication unit 416. The feedback gain multiplication unit 416 multiplies the error amount by a certain feedback gain (a follow-up time constant of the OB clamp process) set in advance. In the feedback gain multiplication unit 416, a value smaller than 1 is set as the feedback gain so that a calculation result is not oscillated. Furthermore, the feedback gain is a small time constant (corresponding to a time constant ab2) described below so as to suppress sensitivity of noise and defects. A correction value calculation unit 415 integrates a result of the calculation performed by the feedback gain multiplication unit 416 so as to calculate a final OB clamp correction value. The calculated correction value is supplied to a correction unit 414. The correction unit 414 subtracts the correction value from the data output from the processing circuit 401a so as to perform a correction process on the image signals and output a result of the correction.

The OB signal extraction unit 417 described first extracts signals corresponding to the OB regions 711 and 712 in the values output from the correction unit 414. By this, an error amount relative to the clamp level is gradually reduced while the correction process is repeatedly performed, and the OB unit output (the dark level) of the correction result is finally converged to coincide with the clamp level.

As described above, the processing circuit (A) 401 performs the OB clamp process using the certain feedback gain after a difference between an offset of the image signal Pa or Pb and an offset of the image signal Pab is corrected by the processes performed by the processing circuit 401*a* and the processing circuit 401*b*.

Figure 10C:
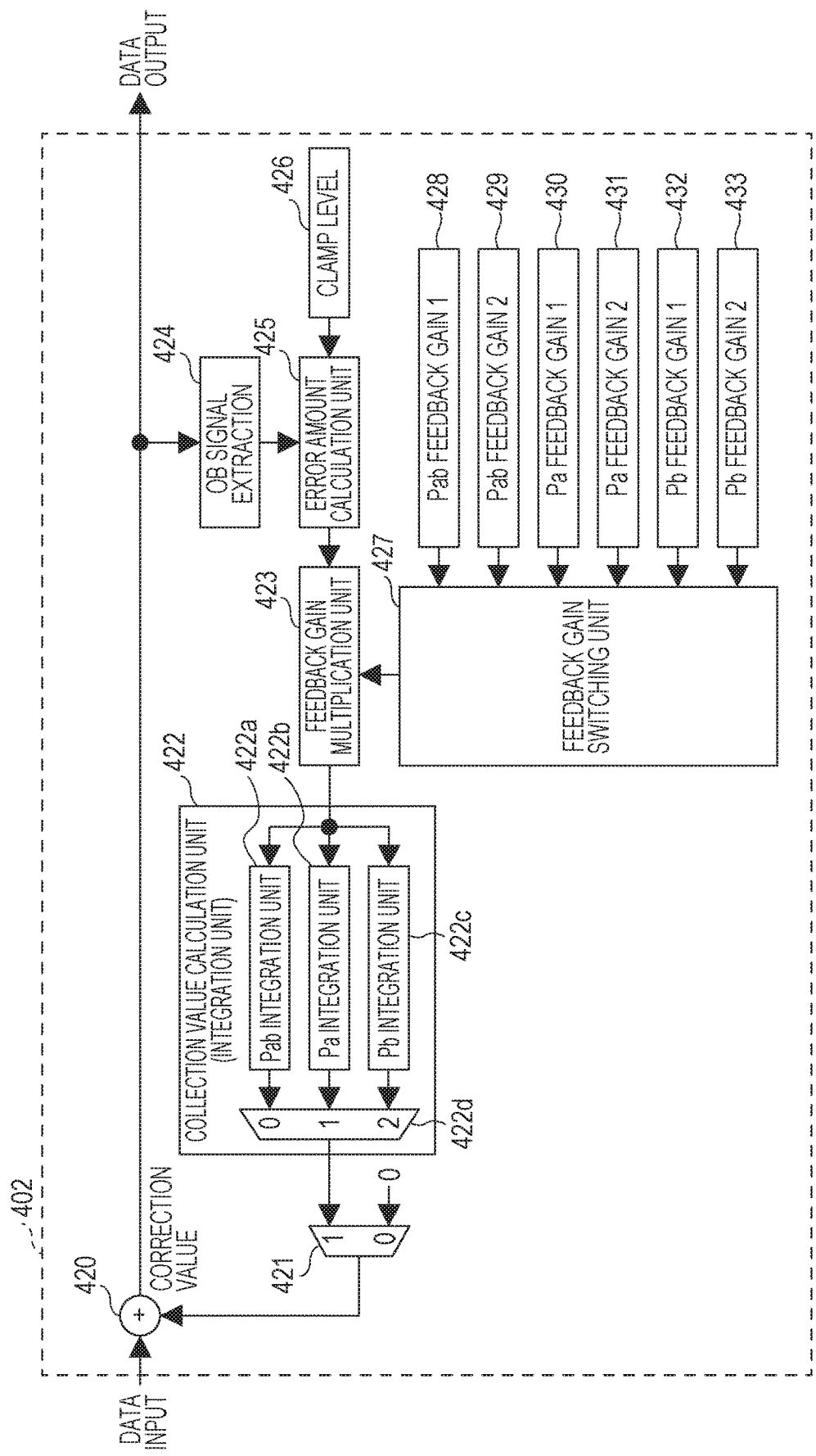

Next, an example of a configuration of the processing circuit (B) 402 will be described with reference to FIG. 10C. An OB signal extraction unit 424 extracts signals of the OB pixels at a timing when data of the OB region 711 or 712 is input. The OB signal extraction unit 424 may supply the OB pixels to be used in the OB clamp process to a processing circuit disposed after an error amount calculation unit 425 one by one or obtain an average value of the plurality of OB pixels. The error amount calculation unit 425 obtains a difference between a correction target value (a clamp level) 426 of the dark level set in advance and a current OB output level output from the OB signal extraction unit 424 so as to calculate an error amount. The calculated error amount is supplied to a feedback gain multiplication unit 423. The feedback gain multiplication unit 423 multiplies the error amount by a feedback gain (a follow-up time constant of the OB clamp process) supplied from a feedback gain switching unit 427. In the feedback gain multiplication unit 423, a value smaller than 1 is set as the feedback gain so that a calculation result is not oscillated. Furthermore, a gain appropriately controlled in advance in accordance with a sensor characteristic or the like is set so as not to be sensitively or excessively affected by noise or defects.

The feedback gain switching unit 427 selects one of a plurality of feedback gains 428 to 433 set in advance in accordance with a coordinate position of a target OB pixel and outputs the selected one of the feedback gains 428 to 433 to the feedback gain multiplication unit 423. The feedback gain switching unit 427 selects the feedback gain 428 or 429 for the image signals Pab in the region Region_c. The feedback gain switching unit 427 selects a large time constant (a time constant ab1) set as the first feedback gain 428 for the image signals Pab in the vertical OB region 711 so as to follow up a large dark current amount at high speed. Furthermore, the feedback gain switching unit 427 selects a small time constant (a time constant ab2) set as the second feedback gain 429 for the image signals Pab in the horizontal OB region 712 so as to suppress sensitivity to noise and defects. Furthermore, the feedback gain switching unit 427 reads the image signals Pa and the image signals Pb in the region Region_i, and selects the feedback gain 430 or 431 for the image signals Pa when the image signals Pa are read. The feedback gain switching unit 427 has a change of the time constant between the vertical OB region 711 and the horizontal OB region 712. Therefore, the feedback gain switching unit 427 selects the first feedback gain 430 for the image signals Pa in the vertical OB region 711 and selects the second feedback gain 431 for the image signals Pa in the horizontal OB region 712. The feedback gain switching unit 427 selects the feedback gain 432 or 433 for the image signals Pb in a period when the image signals Pb are read. The feedback gain switching unit 427 selects the first feedback gain (a time constant b1) 432 for the image signals Pb in the vertical OB region 711 and selects the second feedback gain (a time constant b2) 433 in the horizontal OB region 712.

In one embodiment, the time constants a2 and b2 used for the image signals Pa and Pb, respectively, in the horizontal OB region 712 are larger (faster) than the time constant ab2 used for the image signals Pab. A reading time of the region Region_i is longer than a reading time of the region Region_c of FIG. 4 since both of the image signals Pa and Pb are read as illustrated in FIGS. 5 and 6. Therefore, the number of rows in the region Region_i is normally set small for suppressing the entire reading time. Therefore, the number of rows to be used in the OB clamp is limited and followability of dark shading is deteriorated. To address this situation, large values are to be set to the time constants a2 and b2. Values larger than the time constant ab1 may be set to the time constant a1 and b1 used in the vertical OB region 711 depending on the number of rows in the vertical OB region 711.

A correction value calculation unit 422 integrates a result of the calculation performed by the feedback gain multiplication unit 423 so as to calculate a final OB clamp correction value. A Pab integration unit 422*a* integrates a calculation result of the image signal Pab output from the feedback gain multiplication unit 423. A Pa integration unit 422*b* integrates a calculation result of the image signal Pa output from the feedback gain multiplication unit 423. A Pb integration unit 422*c* integrates a calculation result of the image signal Pb output from the feedback gain multiplication unit 423. A correction value switching unit 422*d* outputs one of results of the integration of the integration units 422*a* to 422*c* as a correction value in accordance with a result of a determination as to whether a correction target pixel corresponds to an image signal Pa, Pb, or Pab. The correction value switching unit 422*d* outputs a value of the Pab integration unit 422*a* for the image signal Pa, a value of the Pa integration unit 422*b* for the image signal Pb, and a value of the Pb integration unit 422*c* for the image signal Pab. A selector 421 outputs a value output from the correction value switching unit 422*d* or 0 as a correction value to a correction unit 420 under control described below. The correction unit 420 subtracts the correction value from data input to the processing circuit 402 so as to perform a correction process on an image signal and output a result of the correction.

The OB signal extraction unit 424 described first extracts signals corresponding to the OB regions 711 and 712 in the signal output from the correction unit 420. By this, an error amount relative to the clamp level is gradually reduced while the correction process is repeatedly performed, and the OB unit output (the dark level) of the correction result is finally converged to coincide with the clamp level.

Figure 11A:
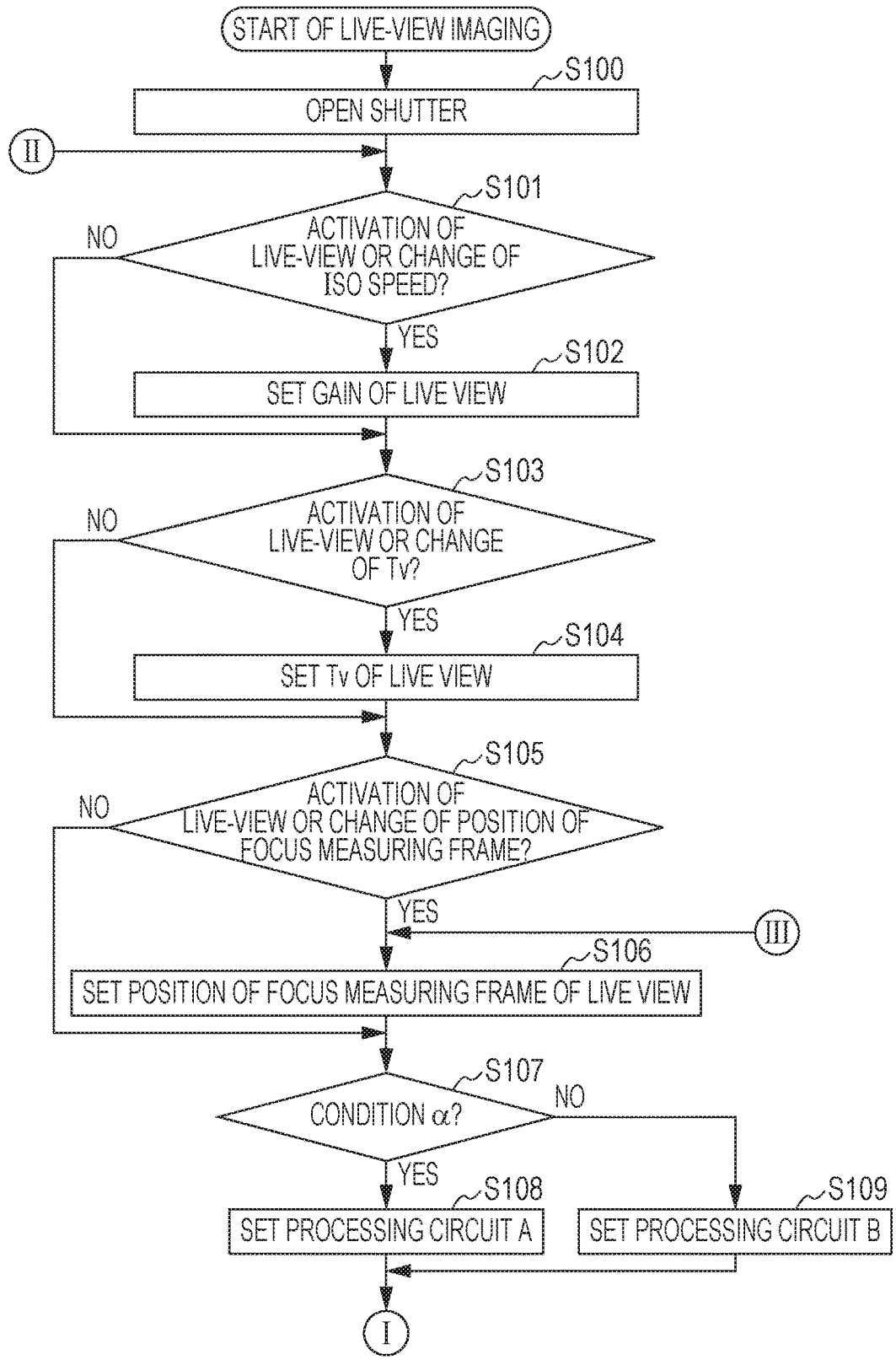
FIGS. 11A and 11B are a flowchart of a method for driving the imaging apparatus according to the first embodiment.

Next, a method for driving the imaging apparatus 1000 according to this embodiment will be described with reference to a flowchart of FIGS. 11A and 11B. The imaging apparatus 1000 has a live-view imaging mode. When live-view imaging is started in accordance with an operation performed on the operation unit 102, the CPU 101 first brings the focal plane shutter 109 into an open state in step S100. By this, the imaging element 100 is brought into an exposure available state.

In step S101, the CPU 101 determines whether one of start of the live-view imaging and a change of an ISO speed is to be performed. When the determination is affirmative, the CPU 101 proceeds to step S102, and otherwise, the CPU 101 proceeds to step S103. It is determined here that the live-view imaging is to be started, and therefore, the CPU 101 proceeds to step S102.

In step S102, the CPU 101 sets a gain corresponding to an ISO speed to the imaging element 100. The CPU 101 sets one of the control signals GAIN0 to GAIN2 corresponding to the ISO speed to the imaging element 100.

Subsequently, in step S103, the CPU 101 determines whether one of start of the live-view imaging and a change of a shutter speed (Tv) is to be performed. When the determination is affirmative, the CPU 101 proceeds to step S104, and otherwise, the CPU 101 proceeds to step S105. It is determined here that the live-view imaging is started, and therefore, the CPU 101 proceeds to step S104.

In step S104, the CPU 101 sets a shutter speed serving as an exposure time of the imaging element 100 to the imaging element 100. The imaging element 100 has an electronic shutter function and controls an accumulation time by an electronic shutter at the time of the live-view imaging.

Subsequently, in step S105, the CPU 101 determines whether one of start of the live-view imaging and a change of a position of the focus measuring frame 714 is to be performed. When the determination is affirmative, the CPU 101 proceeds to step S106, and otherwise, the CPU 101 proceeds to step S107. It is determined here that the live-view imaging is started, and therefore, the CPU 101 proceeds to step S106.

In step S106, the CPU 101 performs various settings to the imaging element 100 or the AF calculation unit 107 in accordance with a position of the focus measuring frame 714. The imaging element 100 sets an arrangement position of the region Region_i as one of the settings in accordance with the position of the focus measuring frame 714.

Figure 12:
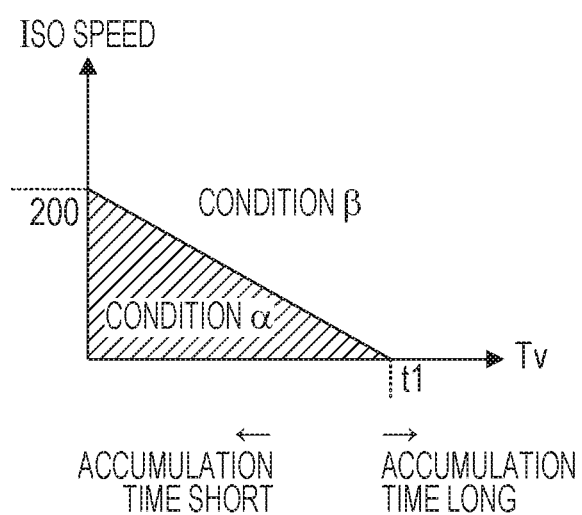
FIG. 12 is a graph illustrating imaging conditions.

In step S107, the CPU 101 determines whether an imaging condition is α or β in accordance with the set ISO speed and the set shutter speed (Tv). The CPU 101 determines that the condition is α when the ISO speed is equal to or lower than ISO 200 and the shutter speed (Tv) is lower than a threshold value t1 (a hatched portion) as illustrated in FIG. 12, and otherwise, the CPU 101 determines that the condition is β. When it is determined that the imaging condition is α, the CPU 101 proceeds to step S108 whereas when it is determined that the imaging condition is β, the CPU 101 proceeds to step S109.

In step S108, the CPU 101 performs a setting of use of the processing circuit (A) 401 as the OB clamp process on the imaging element 100. The CPU 101 sets a position of the region Region_c and a position of the region Region_i in the vertical OB region 711 to the OB_Region_c setting unit 404 and the vertical OB_Region_i setting unit 405 included in the processing circuit (A) 401 illustrated in FIG. 10B, respectively. Furthermore, the CPU 101 performs a setting for selecting the input terminal 1, that is, an output value of the subtracter 411, on the selector 412 and a setting for enabling correction of the processing circuit 401a. Furthermore, the CPU 101 performs a setting for selecting the input terminal 0, that is, an output value of the processing circuit (A) 401, to the selector 403 so as to select the output value of the processing circuit (A) 401 as an output value of the OB clamp processor 400. Thereafter, the CPU 101 proceeds to step S110.

In step S109, the CPU 101 performs a setting of use of the processing circuit (B) 402 as the OB clamp process to the imaging element 100. The CPU 101 sets feedback gains based on the time constants described above as the feedback gains 428 to 433 illustrated in FIG. 10C. Furthermore, the CPU 101 performs a setting for selecting the input terminal 1, that is, an output value of the correction value calculation unit 422, on the selector 421 and a setting for enabling correction of the processing circuit (B) 402. Furthermore, the CPU 101 performs a setting for selecting the input terminal 0, that is, an output value of the processing circuit (B) 402, on the selector 403 so as to select the output value of the processing circuit (B) 402 as an output value of the OB clamp processor 400. Thereafter, the CPU 101 proceeds to step S110.

In step S110, the CPU 101 starts reading of a live-view image from the imaging element 100. Here, the OB clamp processor 400 performs the OB clamp process based on the settings set in step S108 or step S109.

Figure 13A:
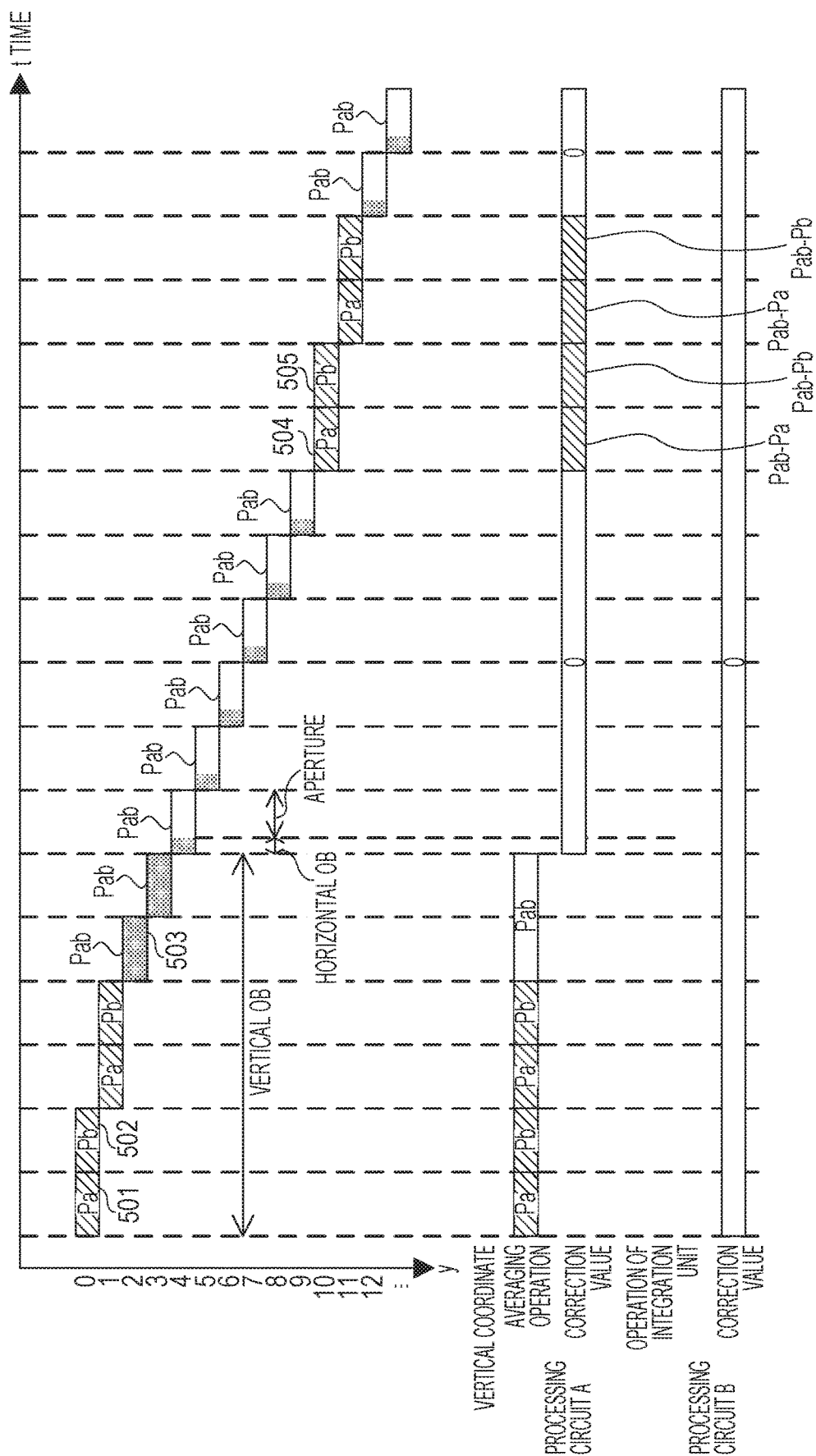
FIGS. 13A and 13B are diagrams illustrating an operation of an OB clamp processing circuit according to the first embodiment.

First, a signal supplied to the OB clamp processor 400 and an operation of the OB clamp processor 400 in a case where a setting for using the processing circuit (A) 401 is performed in step S108 will be described with reference to FIG. 13A. FIG. 13A is a graph of signals input to the OB clamp processor 400 and an operation of the correction value calculation unit 422 described above in time series. A vertical direction corresponds to a vertical coordinate of the imaging element 100. Numbers of rows are partially omitted for simplicity of the description.

Signals 501 and 502 are reading signals in a row corresponding to a vertical coordinate y=0 which is a first reading row. "y=0" indicates a row of the region Region_i in the vertical OB region 711 as illustrated in FIG. 7. In the row corresponding to y=0, the imaging element 100 first outputs image signals Pa (501) for one row in accordance with the operation illustrated in FIG. 5. During this operation, the averaging circuit 406 integrates the image signals Pa and temporarily stores a result of the integration in the Pa average value unit 408. Subsequently, the imaging element 100 similarly outputs image signals Pb (502) for one row in accordance with the operation illustrated in FIG. 6 from the row corresponding to y=0. During this operation, the averaging circuit 406 integrates the image signals Pb and temporarily stores a result of the integration in the Pb average value unit 409.

Subsequently, in a row corresponding to y=1, the imaging element 100 outputs image signals Pa for one row similarly to the case of y=0. The averaging circuit 406 integrates the image signals Pa relative to the Pa integration value which is temporarily stored in the Pa average value unit 408. The row corresponding to y=1 is the last row in the region Region_i in the vertical OB region 711, and therefore, the averaging circuit 406 performs an averaging process on the Pa integration value and stores a result of the averaging process in the Pa average value unit 408. Subsequently, the imaging element 100 similarly outputs image signals Pb for one row from the row corresponding to y=1. The averaging circuit 406 integrates the image signals Pb relative to a Pb integration value which is temporarily stored in the Pb average value unit 409. The row corresponding to y=1 is the last row in the region Region_i in the vertical OB region 711, and therefore, the averaging circuit 406 performs an averaging process on the Pb integration value and stores a result of the averaging process in the Pb average value unit 409.

A signal 503 indicates a reading signal in a row of a vertical coordinate y=2. Since y=2 is included in the region Region_c, the imaging element 100 outputs mixed image signal Pab for one row. While this operation, the averaging circuit 406 integrates the image signals Pab and temporarily stores a result of the integration in the Pab average value unit 407.

Subsequently, in a row corresponding to y=3, the imaging element 100 outputs mixed image signals Pab for one row similarly to the case of y=2. The averaging circuit 406 integrates the image signals Pab relative to a Pab integration value which is temporarily stored in the Pab average value unit 407. The row corresponding to y=3 is the last row in the region Region_c in the vertical OB region 711, and therefore, the averaging circuit 406 performs an averaging process on the Pab integration value and stores a result of the averaging process in the Pab average value unit 407.

Signals for one row from a row corresponding to y=4 includes signals in the horizontal OB region 712 and signals in the opening region 713. The row corresponding to y=4 is included in the region Region_c and image signals Pab are output from the horizontal OB region 712 and the opening region 713. Here, the selector 412 selects the input terminal 0, that is, a 0 value, and therefore, a correction value to be input to the subtracter 413 is 0. Thereafter, the processing circuit 401*b* performs the OB clamp process with a low time constant corresponding to a time constant ab2.

The rows corresponding to y=5 to 9 correspond to the region Region_c and the image signal Pab is output in the horizontal OB region 712 and the opening region 713. As with the case of y=4, in a case of y=5 to 9, a correction value is 0 and the processing circuit 401*b* performs the OB clamp process with a low time constant corresponding to a time constant ab2.

A row corresponding to y=10 is included in the region Region_i in the horizontal OB region 712 and the opening region 713, and image signals Pa and Pb are read. A signal 504 is read as the image signal Pa of the horizontal OB region 712 and the opening region 713. Thereafter, a signal 505 is similarly read as the image signal Pb of the horizontal OB region 712 and the opening region 713. The same is true of a case of y=11. As described above, a difference between the Pab average value and the Pa average value serves as a correction value while the image signal Pa is read, and the correction value described above is subtracted from the image signal Pa. Furthermore, a difference between the Pab average value and the Pb average value serves as a correction value while the image signal Pb is read, and the correction value described above is subtracted from the image signal Pb. Thereafter, the processing circuit 401*b* performs the OB clamp process with a low time constant corresponding to a time constant ab2.

As described above, the processing circuit (A) 401 corrects the image signals Pa of the unit pixels 200 in the opening region 713 included in the pixel region based on the difference between the image signals Pab and Pa of the unit pixels 200 in the OB regions 711 and 712 included in the pixel region. Furthermore, the processing circuit (A) 401 corrects the image signals Pb of the unit pixels 200 in the opening region 713 included in the pixel region based on the difference between the image signals Pab and Pb of the unit pixels 200 in the OB regions 711 and 712 included in the pixel region.

By this, offset differences generated between the image signals Pab and the image signals Pa or the image signals Pb may be cancelled, and the OB clamp process using the horizontal OB region 712 may be performed with a low sensitivity irrespective of the image signals Pab, Pa, and Pb. As a result, as described below, the image processor 106 may provide an excellent image which does not have discontinuity of the region Region_i and the region Region_c even when data corresponding to the image signal Pab is generated by adding the image signal Pa and the image signal Pb in the same row to each other.

Figure 13B:
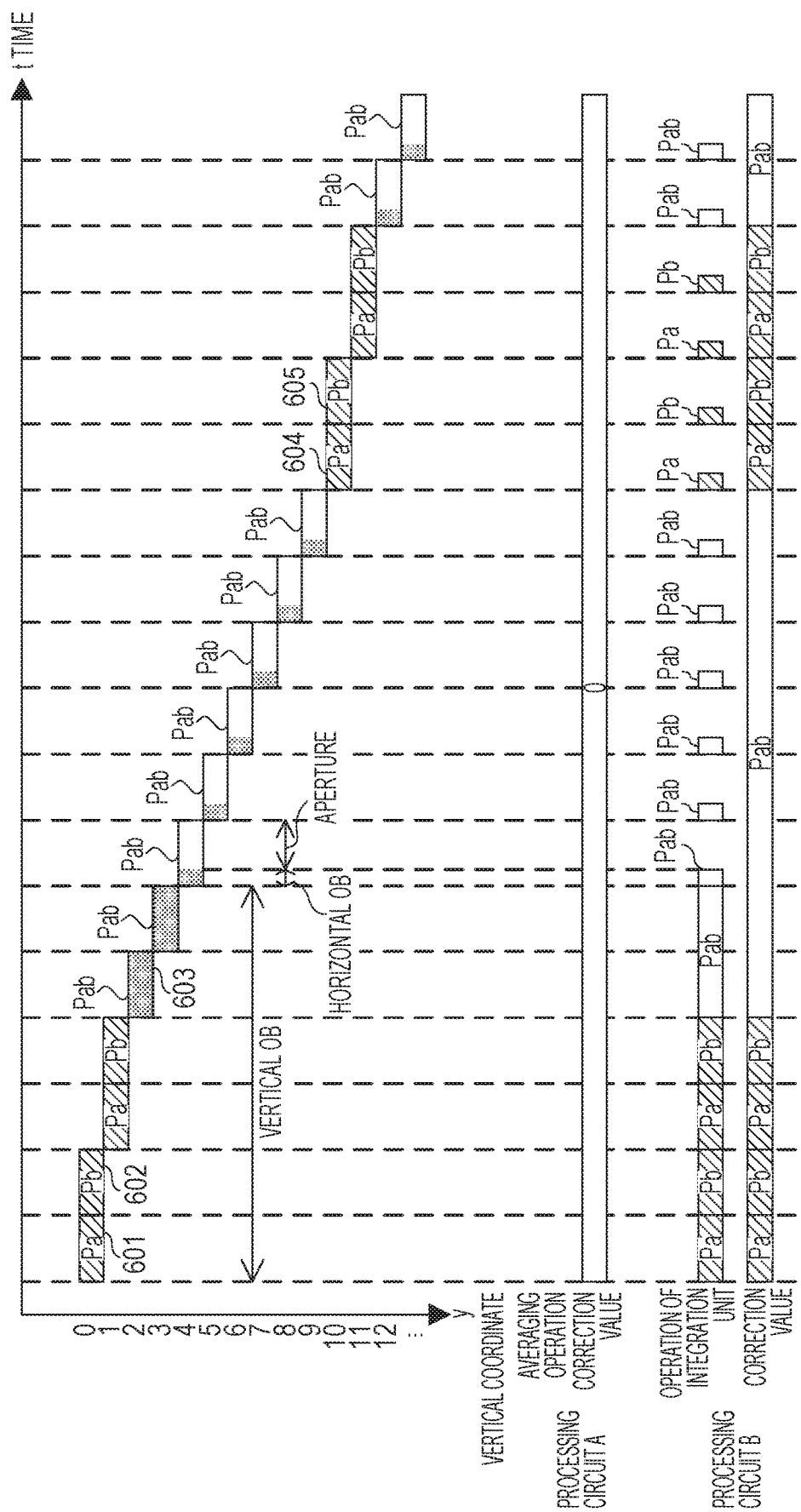

Subsequently, a signal supplied to the OB clamp processor 400 and an operation of the OB clamp processor 400 in a case where a setting for using the processing circuit (B) 402 is performed in step S109 will be described with reference to FIG. 13B. FIG. 13B is a graph of signals input to the OB clamp processor 400 and an operation of the correction value calculation unit 422 described above in time series. A vertical direction corresponds to a vertical coordinate of the imaging element 100.

Signals 601 and 602 are reading signals in a row corresponding to a vertical coordinate y=0 which is a first reading row. "y=0" indicates a row of the region Region_i in the vertical OB region 711 as illustrated in FIG. 7. In the row corresponding to y=0, the imaging element 100 first outputs image signals Pa (601) for one row in accordance with the operation illustrated in FIG. 5. During this operation, the correction value calculation unit 422 performs an integration operation using the Pa integration unit 422*b* for the vertical OB clamp. The correction value calculation unit 422 outputs the input terminal 1 of the selector 421, that is, a correction value for the image signals Pa relative to an output from the imaging element 100. Thereafter, the correction value calculation unit 422 performs switching of correction signals for the image signals Pab, Pa, and Pb in response to an image signal output from the imaging element 100 during the period and outputs the correction signal.

Subsequently, the imaging element 100 similarly outputs image signals Pb (602) for one row in accordance with the operation illustrated in FIG. 6 from the row corresponding to y=0. During this operation, the correction value calculation unit 422 performs an integration operation using the Pb integration unit 422*c*. The same is true of a case of y=1.

A signal 603 indicates a reading signal in a row of a vertical coordinate y=2. Since the row corresponding to y=2 is included in the region Region_c, the imaging element 100 outputs mixed image signals Pab for one row. During this operation, the correction value calculation unit 422 performs an integration operation using the Pab integration unit 422*a* for the vertical OB clamp. The same is true of a case of y=3.

The signals for one row from the row corresponding to y=4 include signals in the horizontal OB region 712 and signals in the opening region 713. The correction value calculation unit 422 performs an integration operation only for a data period of the horizontal OB region 712. Thereafter, the feedback gain switching unit 427 changes a time constant to be selected as described above. The feedback gain switching unit 427 selects a small time constant ab2 in which sensitivity is further suppressed relative to a time constant ab1 used in the vertical OB region 711.

The row corresponding to y=4 is included in the region Region_c and the imaging element 100 outputs image signals Pab in the horizontal OB region 712 and the opening region 713. The correction value calculation unit 422 again performs an integration operation only for a data period of the horizontal OB region 712.

Thereafter, the rows corresponding to y=5 to 9 are included in the region Region_c and the imaging element 100 outputs image signals Pab in the horizontal OB region 712 and the opening region 713. A feedback gain to be used is the time constant ab2.

A row corresponding to y=10 is included in the region Region_i in the horizontal OB region 712 and the opening region 713, and image signals Pa and Pb are read. A signal 604 is read as the image signal Pa of the horizontal OB region 712 and the opening region 713. Thereafter, a signal 605 is similarly read as the image signal Pb of the horizontal OB region 712 and the opening region 713. The same is true of a case of y=11. As described above, a feedback gain in the period in which the image signal Pa is read is the time constant a2 and a feedback gain in the period in which the image signal Pb is read is the time constant b2.

The processing circuit (B) 402 corrects the image signals Pab of the unit pixels 200 in the opening region 713 included in the pixel region based on the image signals Pab of the unit pixels 200 in the OB regions 711 and 712 included in the pixel region. The processing circuit (B) 402 corrects the image signals Pa of the unit pixels 200 in the opening region 713 included in the pixel region based on the image signals Pa of the unit pixels 200 in the OB regions 711 and 712 included in the pixel region. The processing circuit (B) 402 corrects the image signals Pb of the unit pixels 200 in the opening region 713 included in the pixel region based on the image signals Pb of the unit pixels 200 in the OB regions 711 and 712 included in the pixel region.

By this, the OB clamp process performed on the image signals Pa and Pb follows up the dark shading in the vertical direction so that correction is accurately performed, and accordingly, an image of excellent image quality may be obtained. The CPU 101 transfers data to the image processor 106 after reading a live-view image. The image processor 106 adds the image signals Pa and Pb in the same row in the region Region_i so as to generate data corresponding to the image signals Pab. The image processor 106 performs a predetermined development process, a predetermined compression process, and the like on the generated data corresponding to the image signals Pab and data on the image signals Pab in the region Region_c. The display unit 103 displays a live-view image which has been processed. Furthermore, the image signals Pa and Pb are transferred to the AF calculation unit 107. The AF calculation unit 107 performs the focus detection operation described above using the signals Pa and Pb.

In step S111, the CPU 101 determines whether focus is attained (a focusing state) based on the focus detection operation. When the determination is affirmative, the CPU 101 proceeds to step S113, and otherwise, the CPU 101 proceeds to step S112.

In step S112, the focus driving circuit 110 and the focus actuator 112 performs a focusing operation by the focus driving described above based on a defocusing amount under control of the CPU 101. Thereafter, the CPU 101 returns to step S106.

In step S113, the CPU 101 determines whether a still-image capturing switch included in the operation unit 102 has been pressed by a user. When the determination is affirmative, the CPU 101 proceeds to step S114, and otherwise, the CPU 101 proceeds to step S123.

In step S114, the CPU 101 sets a gain corresponding to an ISO speed at a time of still-image capturing to the imaging element 100. The CPU 101 sets one of the control signals GAIN0 to GAIN2 to the imaging element 100 in accordance with the ISO speed.

In step S115, the CPU 101 sets a shutter speed serving as an exposure time of the imaging element 100 to the focal plane shutter 109.

In step S116, the CPU 101 performs various settings to the imaging element 100 or the AF calculation unit 107 in accordance with a position of the focus measuring frame 714. The imaging element 100 sets an arrangement position of the region Region_i as one of the settings in accordance with the position of the focus measuring frame 714.

In step S117, the CPU 101 determines whether the imaging condition is α or β in accordance with the set ISO speed and the set shutter speed (Tv). When it is determined that the imaging condition is α described above, the CPU 101 proceeds to step S118 whereas when it is determined that the imaging condition is β, the CPU 101 proceeds to step S119.

The processes in step S118 and step S119 are the same as those in step S108 and step S109, respectively, and therefore, descriptions thereof are omitted. Thereafter, the CPU 101 proceeds to step S120.

In step S120, the CPU 101 starts reading of a still image from the imaging element 100. Here, the OB clamp processor 400 performs the OB clamp process based on the settings set in step S118 or step S119. Content of the process is the same as that of the process in step S110, and therefore, a description thereof is omitted.

In step S121, the CPU 101 determines whether focus is attained (a focusing state) based on the focus detection operation. When the determination is affirmative, the CPU 101 returns to step S113, and otherwise, the CPU 101 proceeds to step S122.

In step S122, the focus driving circuit 110 and the focus actuator 112 perform a focusing operation by the focus driving described above based on a defocusing amount under control of the CPU 101. Thereafter, the CPU 101 returns to step S113.

In step S123, the CPU 101 determines whether a live-view image termination switch included in the operation unit 102 has been pressed by the user. When the determination is affirmative, the CPU 101 terminates the live-view imaging, and otherwise, the CPU 101 returns to step S101 where it is determined whether the ISO speed has been changed.

By the operation described above, the imaging apparatus 1000 may obtain an image of excellent image quality independently from an obtainment of signals for focus detection by applying the OB clamp process corresponding to an imaging condition in a switching manner while increase in a reading time caused by the obtainment of the signals for focus detection is suppressed.

Note that the imaging apparatus 1000 may freely arrange rows for the region Region_i depending on a mode or an imaging condition or may change a position of the region Region_i for each frame. Furthermore, the regions Region_i may not be arranged in an equal interval and may be freely arranged.

Although the OB clamp processor 400 uses all the signals of the OB pixels in the individual rows in the vertical OB region 711 and all the signals in the OB pixels in the individual rows in the horizontal OB region 712 so as to calculate a correction value, the present disclosure is not limited to this. A number of the OB pixels in the individual rows may be used for calculation of a correction value.

Although different time constants are set for the image signals Pab, Pa, and Pb in both of the vertical OB region 711 and the horizontal OB region 712, time constants for the individual signals may be the same in the vertical OB region 711.

Although a signal of the photodiode 201a and a signal of the photodiode 201b are read in the region Region_i in the foregoing description, the present disclosure is not limited to this. A signal obtained by mixing a signal of the photodiode 201a and a signal of the photodiode 201b may be read, for example. In this case, after the signal of the photodiode 201a is read, the signal of the photodiode 201a and the signal of the photodiode 201b are added in the floating diffusion region 203 and a resultant signal is read. The AF calculation unit 107 may obtain the signal of the photodiode 201b by subtracting the signal of the photodiode 201a from the signal obtained by mixing the signals of the photodiodes 201a and 201b.

Second Embodiment

A configuration of an imaging apparatus 1000 according to a second embodiment of the present disclosure will now be described. The imaging apparatus 1000 of this embodiment has a configuration the same as that of the first embodiment illustrated in FIG. 1, and therefore, a description thereof is omitted. Furthermore, a processing circuit (A)

401 is included in a DFE 233 and a processing circuit (B) 402 is included in an image processor 106 in this embodiment. Furthermore, a parameter in the processing circuit (B) 402 according to this embodiment is different from that in the first embodiment. Time constants of feedback gains set in the processing circuit (B) 402 are described as below.

A first feedback gain 428 for signals Pab is a time constant ab1. A second feedback gain 429 for signals Pab is a time constant ab3. A first feedback gain 430 for signals Pa is a time constant a1. A second feedback gain 431 for signals Pa is a time constant a3. A first feedback gain 432 for signals Pb is a time constant b1. A second feedback gain 433 for signals Pb is a time constant b3. Here, the time constants ab3, a3, and b3 are smaller than the time constants ab2, a2, and b2 described in the first embodiment.

Figure 14A:
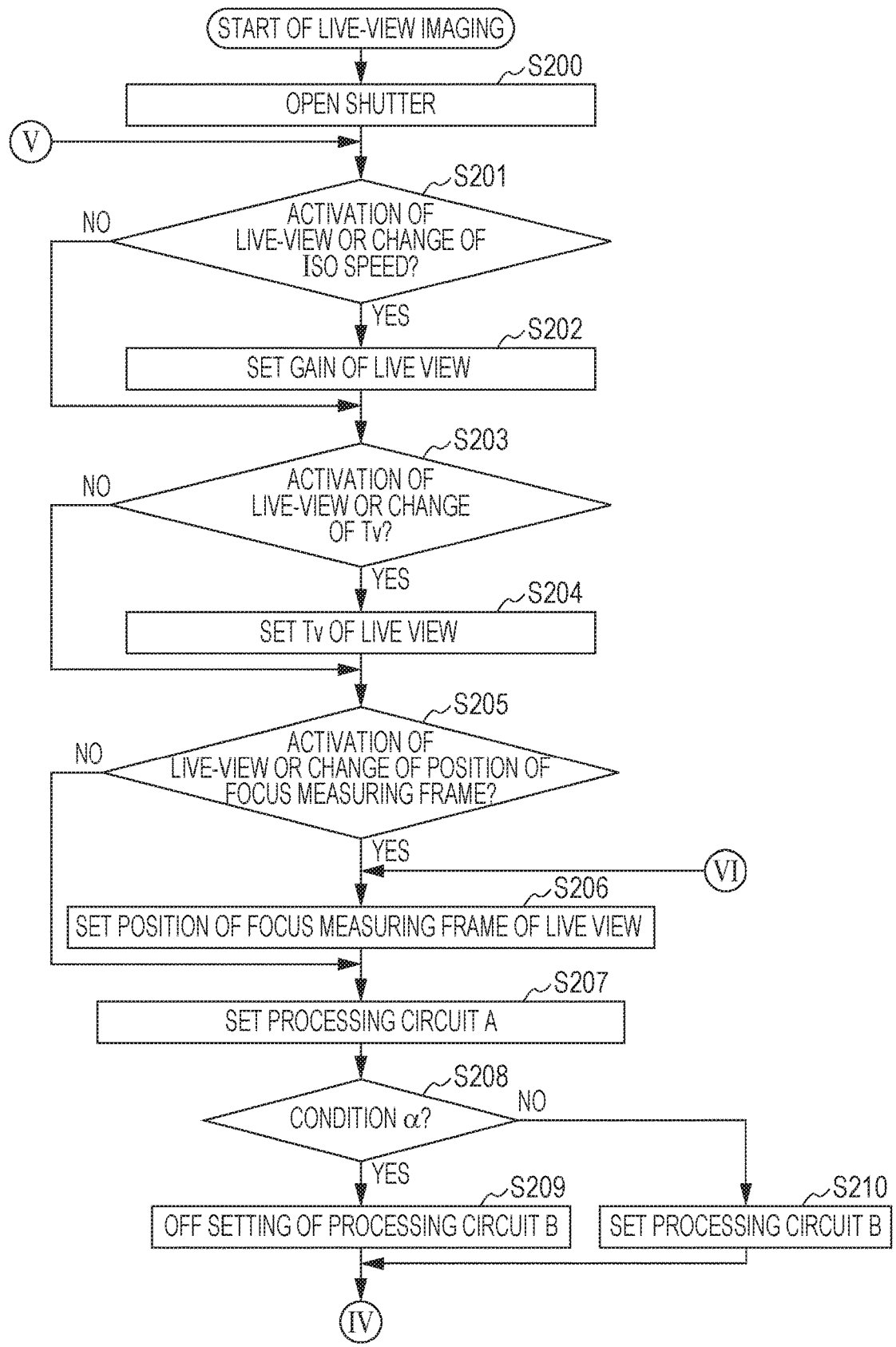
FIGS. 14A and 14B are a flowchart of an operation of an imaging apparatus according to a second embodiment.
Figure 14B:
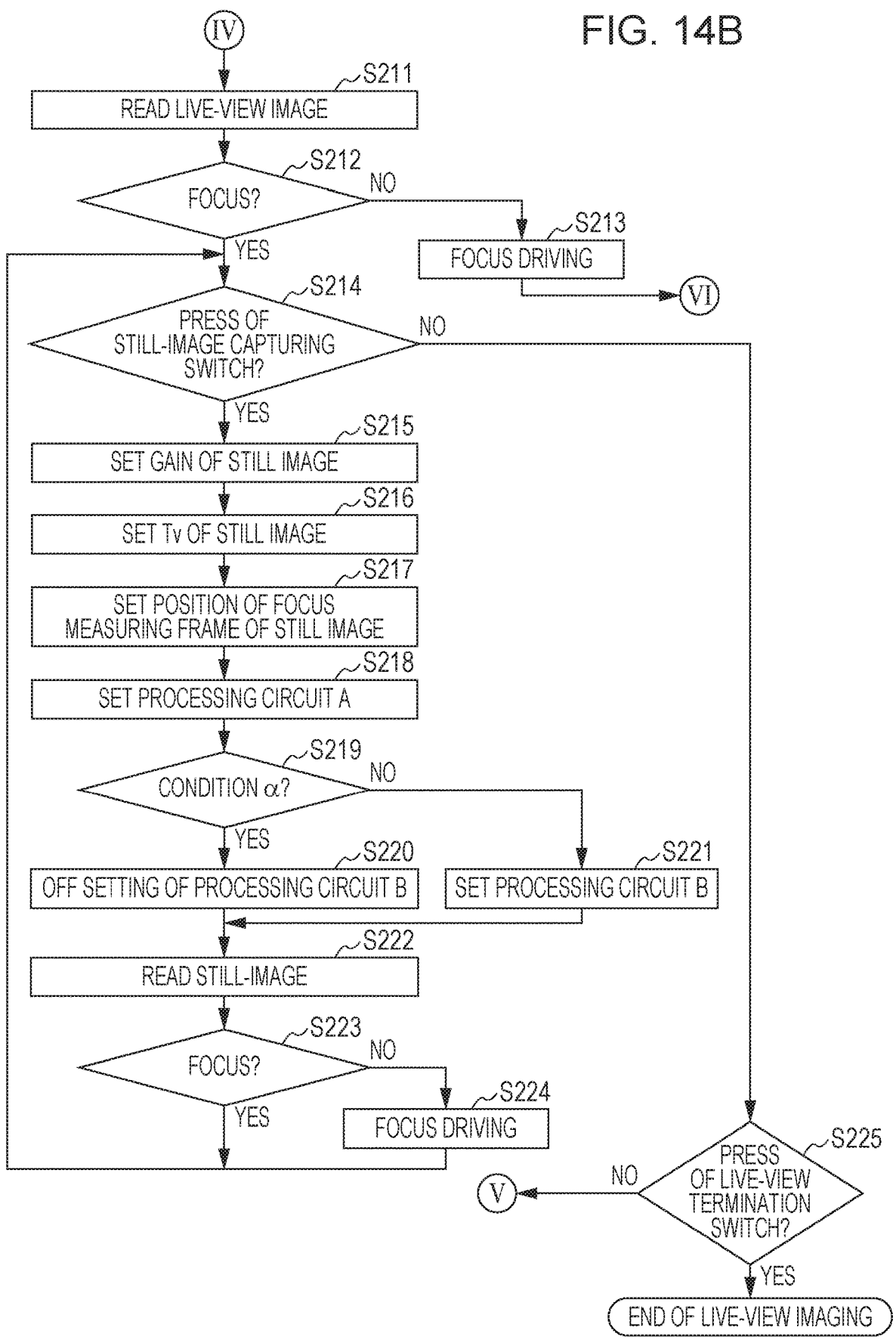

Next, an operation of the imaging apparatus 1000 according to this embodiment will be described with reference to a flowchart of FIGS. 14A and 14B. Since the processes in step S200 to step S206 are the same as those in step S100 to step S106 in the first embodiment, respectively, and therefore, descriptions thereof are omitted.

In step S207, the CPU 101 performs a setting of use of the processing circuit (A) 401 as an OB clamp process on an imaging element 100. A CPU 101 sets a position of a region Region_c and a position of a region Region_i in a vertical OB region 711 to a vertical OB_Region_c setting unit 404 and a vertical OB_Region_i setting unit 405 included in the processing circuit (A) 401 illustrated in FIG. 10B, respectively. Furthermore, the CPU 101 performs a setting for selecting an input terminal 1, that is, an output value of a subtracter 411, to a selector 412 and a setting for enabling correction on the processing circuit 401a. Thereafter, the CPU 101 proceeds to step S208.

In step S208, the CPU 101 determines whether an imaging condition is α or β in accordance with a set ISO speed and a set shutter speed (Tv). In this embodiment, the CPU 101 determines that the condition is α when the ISO speed is equal to or lower than ISO 200 and the shutter speed (Tv) is lower than 1 second, and otherwise, the CPU 101 determines that the condition is β. When it is determined that the imaging condition is α, the CPU 101 proceeds to step S209 whereas when it is determined that the imaging condition is β, the CPU 101 proceeds to step S210.

In step S209, the CPU 101 performs a setting of disabling the processing circuit (B) 402 (correction is Off) as the OB clamp process. The CPU 101 performs a setting of selecting an input terminal 0, that is, a 0 value, on a selector 421 illustrated in FIG. 10C. By this, the correction of the processing circuit (B) 402 is disabled. Accordingly, the processing circuit (A) 401 in the DFE 233 performs the correction whereas the processing circuit (B) 402 in the image processor 106 does not perform correction. Thereafter, the CPU 101 proceeds to step S211.

In step S210, the CPU 101 performs a setting of a use of the processing circuit (B) 402 as the OB clamp process on the imaging element 100. The CPU 101 sets feedback gains based on the time constants described above as the feedback gains 428 to 433 included in the processing circuit (B) 402 illustrated in FIG. 10C. Furthermore, the CPU 101 performs a setting for selecting an input terminal 1, that is, an output value of the correction value calculation unit 422, to the selector 421 and a setting for enabling correction on the processing circuit (B) 402. Accordingly, the processing circuit (A) 401 in the DFE 233 performs the correction. The CPU 101 supplies the corrected signal to the image processor 106. The processing circuit (B) 402 in the image processor 106 performs correction on the signal corrected by the processing circuit (A) 401. Thereafter, the CPU 101 proceeds to step S211.

In step S211, the CPU 101 starts reading of a live-view image from the imaging element 100. Here, the processing circuit (A) 401 or the processing circuit (B) 402 performs the OB clamp process based on the settings set in step S208 to step S210.

Figure 15A:
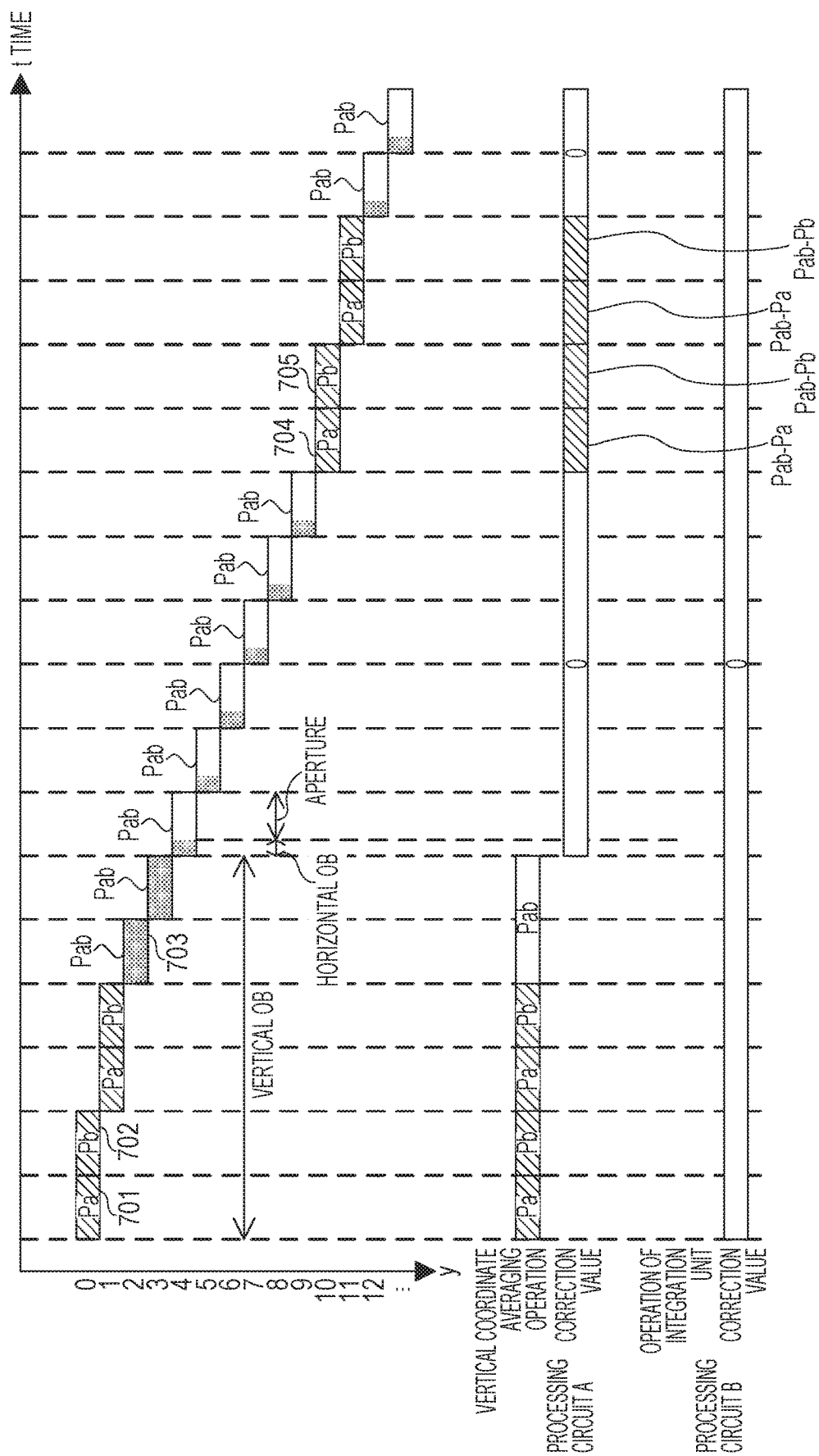
FIGS. 15A and 15B are diagrams illustrating an operation of an OB clamp processing circuit according to the second embodiment.

First, signals supplied to the processing circuit (A) 401 and the processing circuit (B) 402 and operations of the processing circuit (A) 401 and the processing circuit (B) 402 in a case where the CPU 101 determines that the condition is α in step S208 will be described with reference to FIG. 15A. FIG. 15A is a diagram illustrating input signals and an operation of the correction value calculation unit 422 described above in time series. A vertical direction corresponds to a vertical coordinate of the imaging element 100. Numbers of rows are partially omitted for simplicity of the description. The processing circuit (A) 401 performs correction whereas the processing circuit (B) 402 does not perform correction.

First, a process in the processing circuit (A) 401 will be described. Signals 701 and 702 are reading signals in a row corresponding to a vertical coordinate y=0 which is a first reading row. "y=0" indicates a row of the region Region_i in the vertical OB region 711 as illustrated in FIG. 7. In the row corresponding to y=0, first, image signals Pa (701) for one row are supplied to the processing circuit 401a in accordance with the operation illustrated in FIG. 5. During this operation, the averaging circuit 406 included in the processing circuit 401a integrates the image signals Pa and temporarily stores a result of the integration in the Pa average value unit 408. Subsequently, image signals Pb (702) for one row are similarly output from the row corresponding to y=0 by the operation illustrated in FIG. 6. During this operation, the averaging circuit 406 integrates the image signals Pb and temporarily stores a result of the integration in the Pb average value unit 409.

Subsequently, in a row corresponding to y=1, the image signals Pa for one row are output similarly to the case of y=0. The averaging circuit 406 integrates the image signals Pa relative to the Pa integration value which is temporarily stored in the Pa average value unit 408. The row corresponding to y=1 is the last row in the region Region_i in the vertical OB region 711, and therefore, the averaging circuit 406 performs an averaging process on the Pa integration value and stores a result of the averaging process in the Pa average value unit 408. Subsequently, the image signals Pb for one row are similarly output from the row corresponding to y=1. The averaging circuit 406 integrates the image signals Pb relative to the Pb integration value which is temporarily stored in the Pb average value unit 409. The row corresponding to y=1 is the last row in the region Region_i in the vertical OB region 711, and therefore, the averaging circuit 406 performs an averaging process on the Pb integration value and stores a result of the averaging process in the Pb average value unit 409.

A signal 703 indicates a reading signal in a row of a vertical coordinate y=2. Since the row corresponding to y=2 is included in the region Region_c, mixed image signals Pab for one row are output. During this operation, the averaging circuit 406 integrates the image signals Pab and temporarily stores a result of the integration in the Pab average value unit 407.

Subsequently, in a row corresponding to y=3, mixed image signals Pab for one row are output similarly to the case of y=2. The averaging circuit 406 integrates the image signals Pab relative to the Pab integration value which is temporarily stored in the Pab average value unit 407. The row corresponding to y=3 is the last row in the region Region_i in the vertical OB region 711, and therefore, the averaging circuit 406 performs an averaging process on the Pab integration value and stores a result of the averaging process in the Pab average value unit 407.

The signals for one row from the row corresponding to y=4 include signals in the horizontal OB region 712 and signals in the opening region 713. The row corresponding to y=4 is included in the region Region_c and image signals Pab are output from the horizontal OB region 712 and the opening region 713. Here, the selector 412 selects the input terminal 0, that is, a 0 value, and a correction value to be input to the subtracter 413 is 0. Thereafter, the processing circuit 401b performs the OB clamp process with a low time constant corresponding to a time constant ab2.

Thereafter, the rows corresponding to y=5 to 9 are included in the region Region_c and image signals Pab are output from the horizontal OB region 712 and the opening region 713. As with the case of y=4, a correction value is 0 and the processing circuit 401b performs the OB clamp process with a low time constant corresponding to a time constant ab2.

A row corresponding to y=10 is included in the region Region_i in the horizontal OB region 712 and the opening region 713, and image signals Pa and Pb are read. A signal 704 is read as an image signal Pa of the horizontal OB region 712 and the opening region 713. Thereafter, a signal 705 is similarly read as an image signal Pb of the horizontal OB region 712 and the opening region 713. The same is true of a case of y=11. As described above, a difference between the Pab average value and the Pa average value serves as a correction value while the image signals Pa are read, and the correction value described above is subtracted from the image signals Pa. Furthermore, a difference between the Pab average value and the Pb average value serves as a correction value while the image signals Pb are read, and the correction value described above is subtracted from the image signals Pb. Thereafter, the processing circuit 401b performs the OB clamp process with a low time constant corresponding to a time constant ab2.

As described above, the processing circuit (A) 401 corrects the image signals Pa of the unit pixels 200 in the opening region 713 based on differences between the image signals Pab and Pa of the unit pixels 200 in the OB regions 711 and 712. Furthermore, the processing circuit (A) 401 corrects the image signals Pb of the unit pixels 200 in the opening region 713 based on differences between the image signals Pab and Pb of the unit pixels 200 in the OB regions 711 and 712.

By this, offset differences generated between the image signals Pab and the image signals Pa or the image signals Pb may be cancelled, and the OB clamp process using the horizontal OB region 712 may be performed with a low sensitivity irrespective of the image signals Pab, Pa, and Pb. As a result, as described below, the image processor 106 may provide an excellent image which does not have discontinuity of the region Region_i and the region Region_c even when data corresponding to the image signals Pab is generated by adding the image signals Pa and the image signals Pb in the same row to each other.

The imaging element 100 outputs data obtained by cancelling a difference among offsets of the image signals Pab, Pa, and Pb using the processing circuit (A) 401. Thereafter, the CPU 101 successively supplies the data to the image processor 106. In the case of the condition a, the processing circuit (B) 402 does not perform a correction process.

Figure 15B:
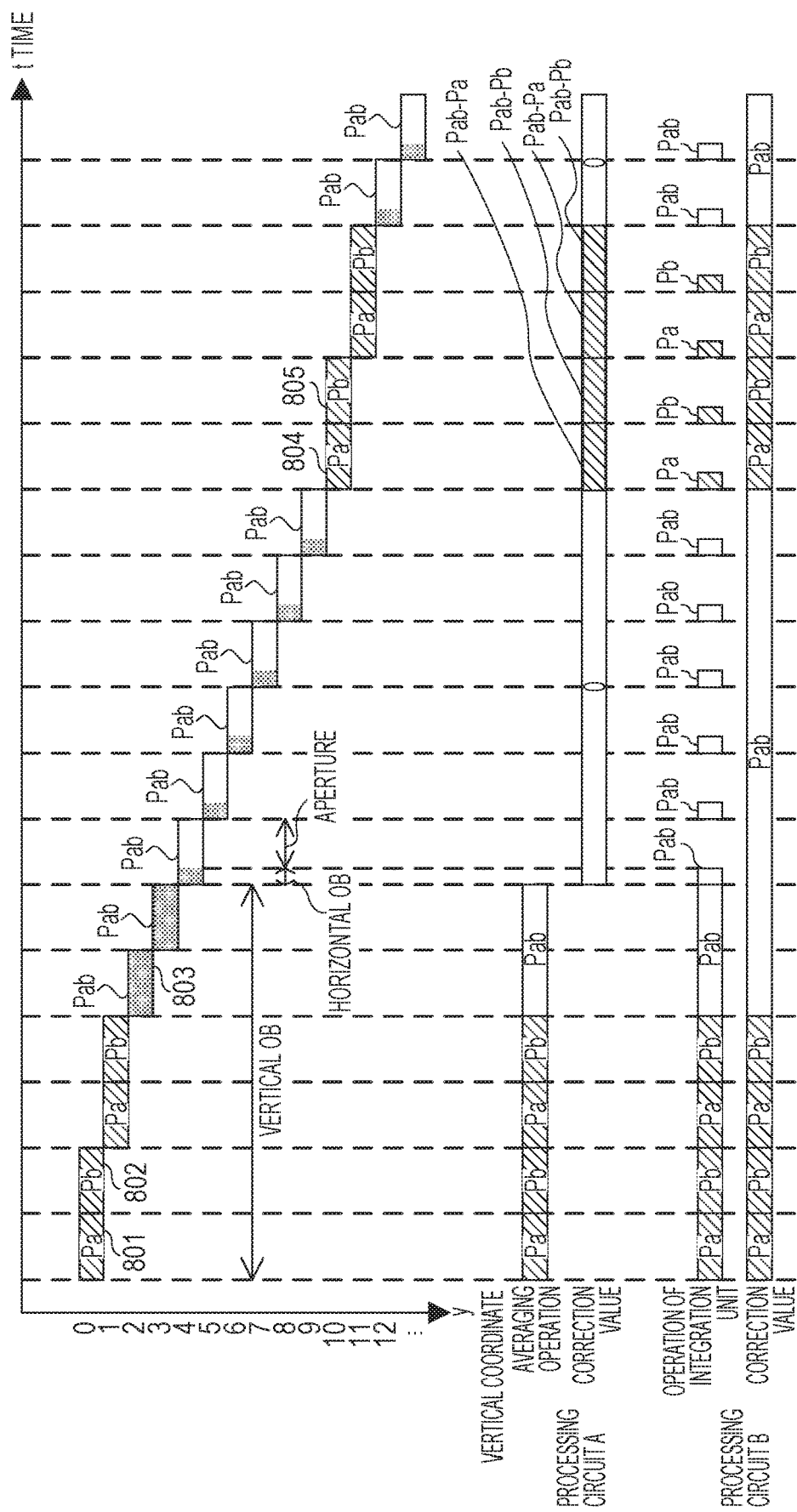

Next, signals supplied to the processing circuit (A) 401 and the processing circuit (B) 402 and operations of the processing circuit (A) 401 and the processing circuit (B) 402 in a case where the CPU 101 determines that the condition is β in step S208 will be described with reference to FIG. 15B. FIG. 15B is a diagram illustrating input signals and an operation of the correction value calculation unit 422 described above in time series. A vertical direction corresponds to a vertical coordinate of the imaging element 100. Numbers of rows are partially omitted for simplicity of the description. First, the processing circuit (A) 401 in the DFE 233 performs correction before the processing circuit (B) 402 in the image processor 106 performs correction on signals corrected by the processing circuit (A) 401. The process performed by the processing circuit (A) 401 is the same as that in the case of the condition α, and therefore, a description thereof is omitted.

Next, a process in the processing circuit (B) 402 will be described. "y=0" indicates a row included in the region Region_i in the vertical OB region 711 as illustrated in FIG. 7. In the row corresponding to y=0, first, image signals Pa (801) for one row are output in accordance with the operation illustrated in FIG. 5. During this operation, the correction value calculation unit 422 performs an integration operation using the Pab integration unit 422a for the vertical OB clamp. The correction value calculation unit 422 outputs the input terminal 0, that is, a correction value for the image signals Pab, irrespective of an output from the imaging element 100.

Subsequently, the image signals Pb (802) for one row are similarly output from the row corresponding to y=0 by the operation illustrated in FIG. 6. During this operation, the correction value calculation unit 422 performs an integration operation using the Pab integration unit 422a. The same is true of a case of y=1.

A signal 803 indicates a reading signal in a row of a vertical coordinate y=2. Since the row corresponding to y=2 is included in the region Region_c, mixed image signals Pab for one row are output. During this operation, the correction value calculation unit 422 performs an integration operation using the Pab integration unit 422a for the vertical OB clamp. The same is true of a case of y=3.

The signals for one row from the row corresponding to y=4 include signals in the horizontal OB region 712 and signals in the opening region 713. The correction value calculation unit 422 performs an integration operation only for a data period of the horizontal OB region 712. Thereafter, the feedback gain switching unit 427 changes a time constant to be selected as described above. The feedback gain switching unit 427 selects a small time constant ab3 for further suppressing sensitivity relative to a time constant ab1 used in the vertical OB region 711.

The row corresponding to y=4 is included in the region Region_c and image signals Pab are output from the horizontal OB region 712 and the opening region 713. The correction value calculation unit 422 performs an integration operation only for a data period of the horizontal OB region 712.

Thereafter, the rows corresponding to y=5 to 9 are included in the region Region_c and image signals Pab are output from the horizontal OB region 712 and the opening region 713. A feedback gain to be used is the time constant ab3.

A row corresponding to y=10 is included in the region Region_i and image signals Pa and Pb are read from the horizontal OB region 712 and the opening region 713. A signal 804 is read as the image signals Pa of the horizontal OB region 712 and the opening region 713. Thereafter, a signal 805 is similarly read as the image signals Pb of the horizontal OB region 712 and the opening region 713. The same is true of a case of y=11. As described above, a time constant ab3 is used as both of the feedback gains of the image signals Pa and Pb which are being read.

Figure 11B:
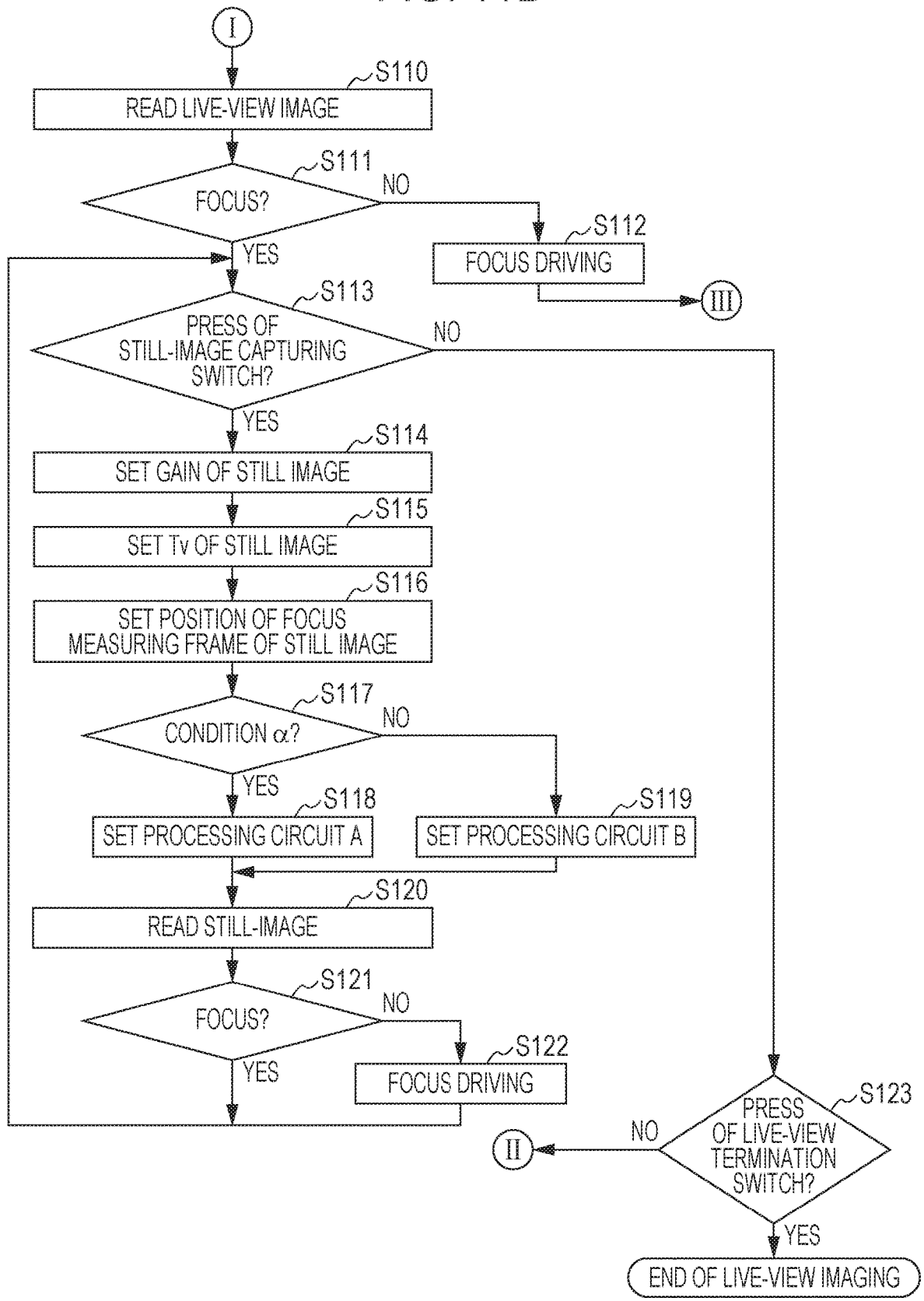

The processes in step S212 to step S225 are the same as the processes in step S111 to step S123 in FIG. 11B. Note that the process in step S218 is the same as that in step S207. The processes in step S220 and step S221 are the same as those in step S209 and step S210, respectively.

As described above, the processing circuit (B) 402 corrects the image signals Pab of the unit pixels 200 in the opening region 713 based on the image signals Pab of the unit pixels 200 in the OB regions 711 and 712. Furthermore, the processing circuit (B) 402 corrects the image signals Pa of the unit pixels 200 in the opening region 713 based on the image signals Pa of the unit pixels 200 in the OB regions 711 and 712. Furthermore, the processing circuit (B) 402 corrects the image signals Pb of the unit pixels 200 in the opening region 713 based on the image signals Pb of the unit pixels 200 in the OB regions 711 and 712.

By this, offset differences generated between the image signals Pab and the image signals Pa or the image signals Pb may be cancelled, and the OB clamp process using the horizontal OB region 712 may be performed with a low sensitivity (the time constant ab3) irrespective of the image signals Pab, Pa, and Pb. As a result, as described below, the image processor 106 may provide an excellent image which does not have discontinuity of the region Region_i and the region Region_c even when data corresponding to the image signals Pab is generated by adding the image signals Pa and the image signals Pb in the same row to each other. Furthermore, the OB clamp process on the image signals Pa and Pb follows up the dark shading in the vertical direction so that correction is accurately performed, and accordingly, an image of excellent image quality may be obtained.

By the operation described above, an image of excellent image quality may be obtained independently from an obtainment of signals for focus detection by applying the OB clamp process corresponding to an imaging condition in a switching manner while increase in a reading time caused by the obtainment of the signal for focus detection is suppressed. Furthermore, a case where differences between offsets of the image signals Pa/Pb and the image signals Pab change in a vertical direction in accordance with an imaging condition may be addressed.

In this embodiment, the process in the horizontal OB region 712 is performed by the processing circuit (B) 402 after the process in the processing circuit (A) 401. The processing circuit (A) 401 cancels the differences between the offsets of the image signals Pa/Pb and the image signals Pab in advance so that the processing circuit (B) 402 may perform the clamp process on the horizontal OB region 712 using a small feedback gain (a time constant). By this, the image quality may be improved while a correction error of the process performed by the processing circuit (B) 402 is reduced.

Third Embodiment

A configuration of an imaging apparatus 1000 according to a third embodiment of the present disclosure will now be described. The imaging apparatus 1000 of this embodiment has a configuration the same as that of the first embodiment illustrated in FIG. 1, and therefore, a description thereof is omitted.

Figure 16A:
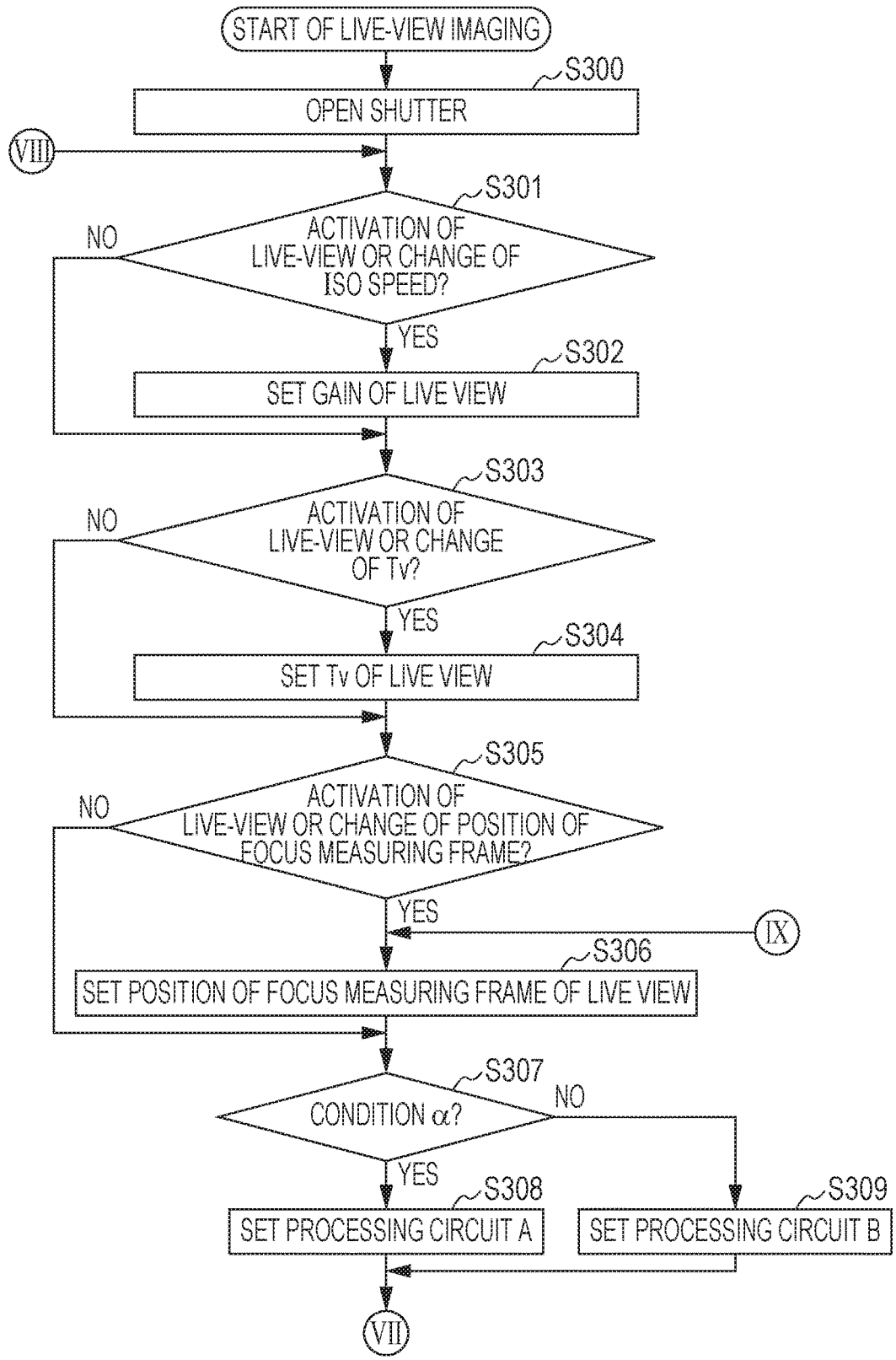
FIGS. 16A and 16B are a flowchart of an operation of an imaging apparatus according to a third embodiment.
Figure 16B:
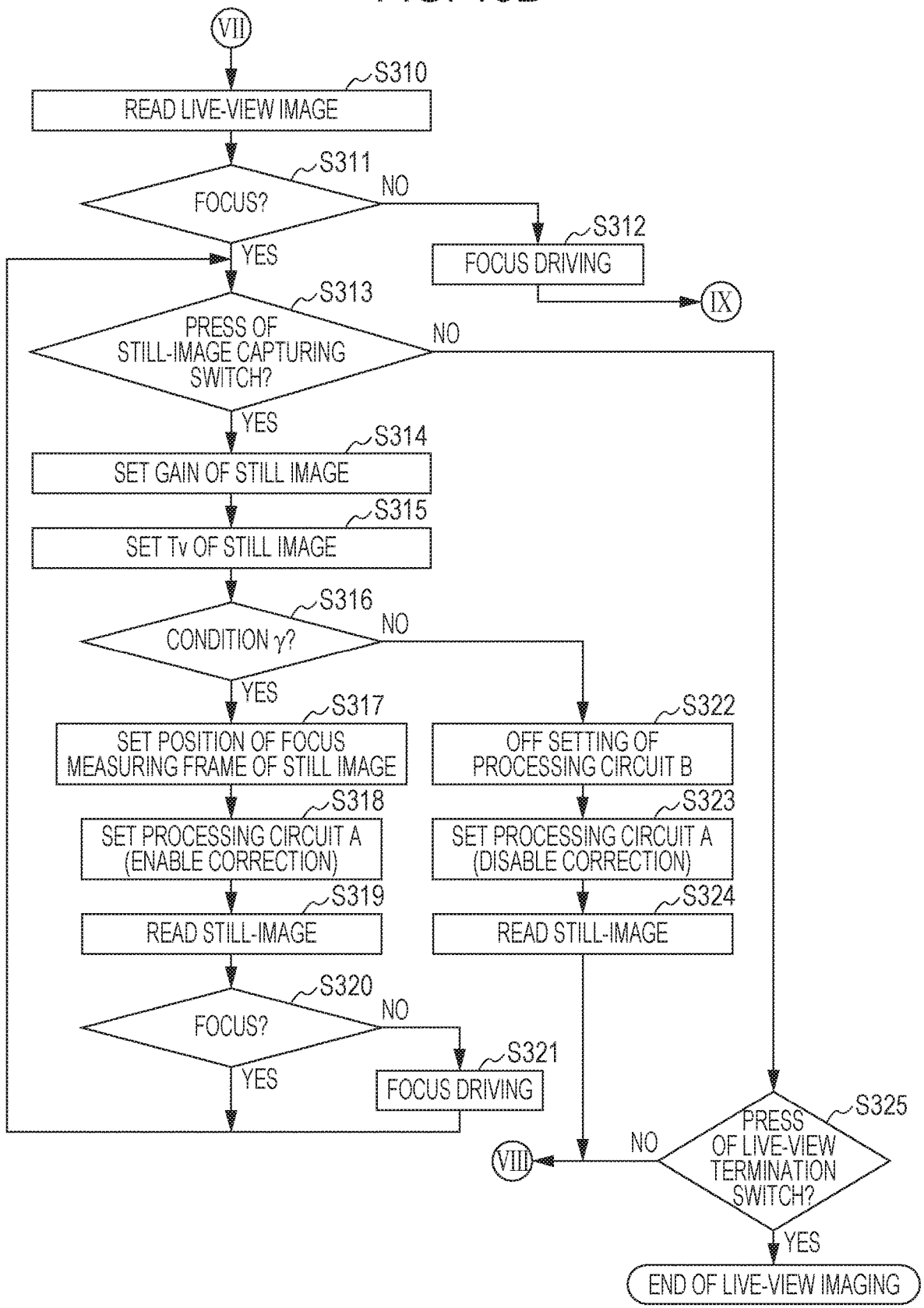

Next, an operation of the imaging apparatus 1000 according to this embodiment will be described with reference to a flowchart of FIGS. 16A and 16B. Since processes in step S300 to step S315 are the same as those in step S100 to step S115 in the first embodiment, and therefore, descriptions thereof are omitted.

Figure 17:
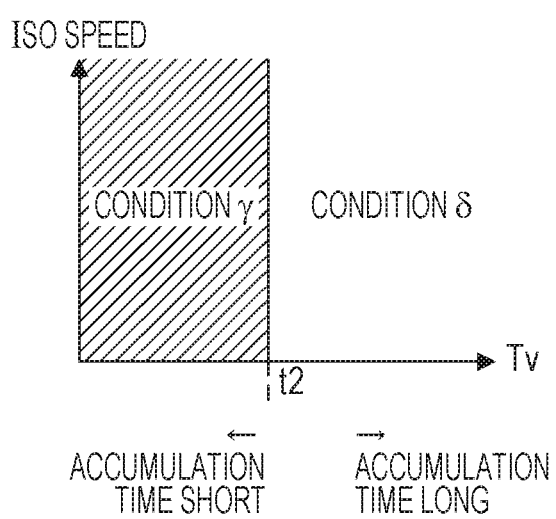
FIG. 17 is a graph illustrating imaging conditions.

In step S316, the CPU 101 determines whether an imaging condition is γ or δ in accordance with a set shutter speed (Tv). In this embodiment, the CPU 101 determines that the condition is γ when the shutter speed (Tv) is lower than a threshold value t2 (a hatched portion) as illustrated in FIG. 17, and otherwise, the CPU 101 determines the condition is δ. When it is determined that the imaging condition is γ, the CPU 101 proceeds to step S317 whereas when it is determined that the imaging condition is δ, the CPU 101 proceeds to step S322.

Processes in step S317, step S318, step S319, step S320, step S321, and step S325 are the same as the processes in step S116, step S118, step S120, step S121, step S122, and step S123, respectively, and therefore, descriptions thereof are omitted. In step S318, the CPU 101 performs a setting for using processing circuits 401a and 401b included in the processing circuit (A) 401 but not using the processing circuit (B) 402. In step S319, a vertical scanning circuit 209 performs reading in a first reading mode on a number of rows of a plurality of unit pixels 200 in a region Region_c and reading in a second reading mode on the other rows of the plurality of unit pixels 200 in a region Region_i. In this case, the processing circuit 401a serving as an OB clamp processing circuit corrects image signals Pa of the unit pixels 200 in an opening region 713 based on differences between image signals Pab and Pa of the unit pixels 200 in OB regions 711 and 712. Furthermore, the processing circuit 401a corrects the image signals Pb of the unit pixels 200 in the opening region 713 based on differences between the image signals Pab and Pa of the unit pixels 200 in the light shielding regions 711 and 712. The processing circuit 401b corrects signals of the unit pixels 200 in the opening region 713 based on amounts of errors between the signals of the unit pixels 200 in the light shielding regions 711 and 712 and a dark level target value 419.

Figure 18:
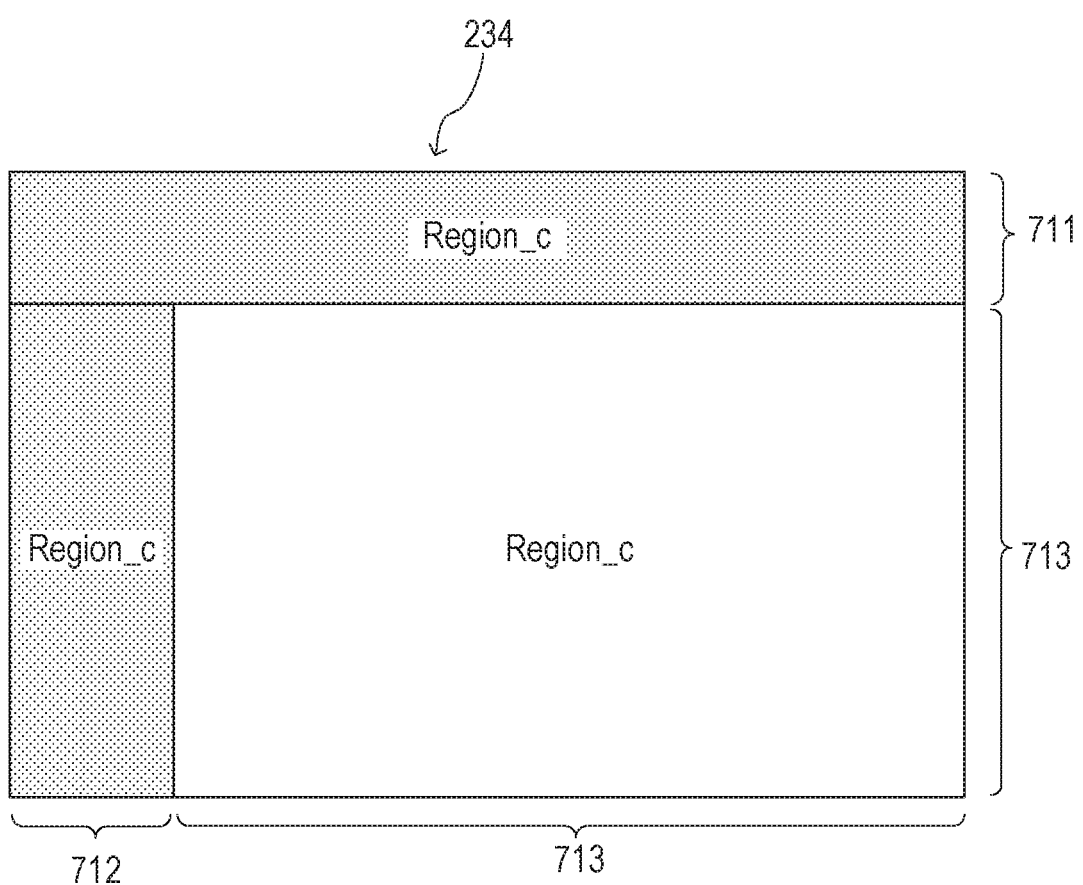
FIG. 18 is a diagram illustrating reading of an imaging element according to the third embodiment.

In step S322, the CPU 101 performs a setting for turning off division readout on the imaging apparatus 1000. Here, the CPU 101 reads a region of all the unit pixels 200 in the pixel region 234 as a region Region_c as illustrated in FIG. 18.

Thereafter, in step S323, the CPU 101 performs a setting for using the processing circuit 401b included in the processing circuit (A) 401 and disabling correction of the processing circuit 401a. The processing circuit 401a is not operated but the processing circuit 401b is operated. Furthermore, the CPU 101 performs a setting for selecting an input terminal 1, that is, a 0 value, to the selector 412 and a setting for disabling correction of the processing circuit 401a. Furthermore, the CPU 101 performs a setting for selecting the input terminal 0, that is, an output value of the processing circuit (A) 401, to the selector 403 so as to select an output value of the processing circuit (A) 401 as an output value of the OB clamp processor 400. Thereafter, the CPU 101 proceeds to step S324.

Figure 19:
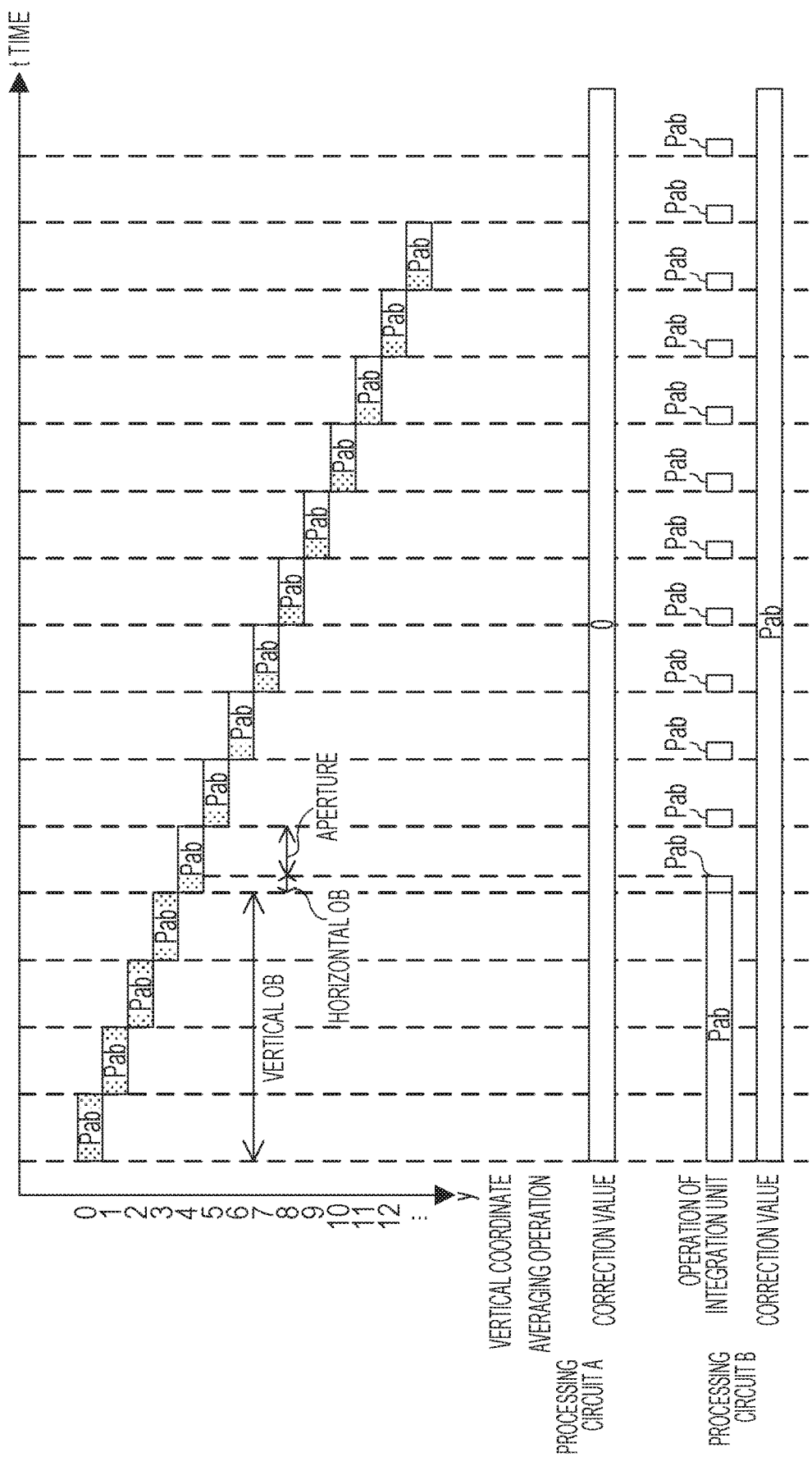
FIG. 19 is a diagram illustrating an operation of an OB clamp processing circuit according to the third embodiment.

In step S324, the CPU 101 starts reading of a still image on the imaging element 100. A vertical scanning circuit 209 performs reading on all rows in the plurality of unit pixels 200 in the region Region_c in the first reading mode. Here, the OB clamp processor 400 performs the OB clamp process based on the setting performed in step S323. A signal supplied to the OB clamp processor 400 and an operation of the OB clamp processor 400 at this time will be described with reference to FIG. 19. FIG. 19 is a diagram of signals input to the OB clamp processor 400 and an operation of the processing circuit (A) 401 described above in time series. A vertical direction corresponds to a vertical coordinate of the imaging element 100.

"y=0" indicates a row included in the region Region_c in the vertical OB region 711. In the row corresponding to y=0, image signals Pa for one row are output in accordance with the operation illustrated in FIG. 4. During this operation, a correction value of the processing circuit 401a is 0 (correction is disabled) irrespective of output from the imaging element 100. The same is true of cases of y=1 to 3.

The signals for one row from the row corresponding to y=4 include signals in the horizontal OB region 712 and signals in the opening region 713. The row corresponding to y=4 is included in the region Region_c and image signals Pab are output from the horizontal OB region 712 and the opening region 713. A correction value of the processing circuit 401a is 0. Thereafter, the processing circuit 401b performs the OB clamp process with a low time constant corresponding to a time constant ab2.

Thereafter, the rows corresponding to y=5 to 12 are included in the region Region_c and image signals Pab are output from the horizontal OB region 712 and the opening region 713. A correction value of the processing circuit 401a is 0. Thereafter, the processing circuit 401b performs the OB clamp process with a low time constant corresponding to a time constant ab2. Thereafter, the CPU 101 returns to step S301.

As described above, the processing circuit 401b serving as an OB clamp processing circuit corrects signals of the unit pixels 200 in the opening region 713 based on amounts of errors between the signals of the unit pixels 200 in the OB regions 711 and 712 and the dark level target value 419. Note that the processing circuit 401a has a correction value of 0 and the correction is not performed.

By the operation described above, an image of excellent image quality may be obtained independently from an obtainment of signals for focus detection by applying a setting of rows to be subjected to division readout in accordance with an imaging condition and switching of the OB clamp process while increase in a reading time caused by the obtainment of the signals for focus detection is suppressed. Furthermore, in a case of a shutter speed (Tv) corresponding to a long accumulation time, division readout is turned off and only totaling readout is performed so that the number of pixels to be integrated in vertical OB clamp is increased. By this, a case where an offset amount which is to be clamped is increased due to generation of dark current may be addressed. Furthermore, a case where division readout is not included in the OB clamp process may be addressed by changing an operation of the OB clamp process.

According to the first to third embodiment, image quality may be attained by correcting signals of the imaging element 100 in accordance with an imaging condition while increase in a reading time caused by an obtainment of signals for focus detection is suppressed.

Other Embodiments

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-077666 filed Apr. 10, 2017, which is hereby incorporated by reference herein in its entirety.

What is claimed is:

1. An imaging apparatus comprising:
    a pixel region having a plurality of unit pixels arranged in a matrix, each of the unit pixels including a micro lens and first and second photoelectric conversion units receiving light which is transmitted through the micro lens;
    a reading controller configured to read first signals obtained by mixing signals output from the first and second photoelectric conversion units in rows of a first reading mode and read second signals at least including signals of the first photoelectric conversion units and third signals at least including signals of the second photoelectric conversion units in rows of a second reading mode; and
    an optical black (OB) clamp processor configured to correct signals in the unit pixels included in an opening region in the pixel region based on signals output from the unit pixels included in a light shielding region in the pixel region,
    wherein the OB clamp processor performs one of various correction processes depending on an imaging condition.

2. The imaging apparatus according to claim 1,
    wherein the second signals are output from the first photoelectric conversion units, and
    the third signals are output from the second photoelectric conversion units.

3. The imaging apparatus according to claim 1,
    wherein the second signals are output from the first photoelectric conversion units, and the third signals are obtained by mixing the signals output from the first and second photoelectric conversion units.

4. The imaging apparatus according to claim 1, wherein the OB clamp processor
corrects the second signals of the unit pixels in the opening region in the pixel region based on the first signals and the second signals of the unit pixels included in the light shielding region in the pixel region and corrects the third signals of the unit pixels in the opening region in the pixel region based on the first signals and the third signals of the unit pixels included in the light shielding region in the pixel region when the imaging condition is a first condition, and
corrects the second signals of the unit pixels included in the opening region in the pixel region based on the second signals of the unit pixels included in the light shielding region in the pixel region and corrects the third signals of the unit pixels included in the opening region in the pixel region based on the third signals of the unit pixels included in the light shielding region in the pixel region when the imaging condition is a second condition.

5. The imaging apparatus according to claim 1, wherein the OB clamp processor includes
a first OB clamp processor which corrects the second signals of the unit pixels included in the opening region in the pixel region based on the first signals and the second signals of the unit pixels included in the light shielding region in the pixel region and corrects the third signals of the unit pixels included in the opening region in the pixel region based on the first signals and the third signals of the unit pixels included in the light shielding region in the pixel region, and
a second OB clamp processor which corrects the second signals of the unit pixels included in the opening region in the pixel region based on the second signals of the unit pixels included in the light shielding region in the pixel region and corrects the third signals of the unit pixels included in the opening region in the pixel region based on the third signals of the unit pixels included in the light shielding region in the pixel region,
the first OB clamp processor performs correction when the imaging condition is a first condition, and
the first OB clamp processor performs correction and the second OB clamp processor performs correction on signals which have been corrected by the first OB clamp processing when the imaging condition is the second condition.

6. The imaging apparatus according to claim 1, wherein the reading controller
performs reading in the first reading mode on a number of rows of the plurality of unit pixels and performs reading in the second reading mode on the other rows of the plurality of unit pixels when the imaging condition is a first condition, and
performs reading in the first reading mode on all the rows of the plurality of unit pixels when the imaging condition is a second condition.

7. The imaging apparatus according to claim 6, wherein the OB clamp processor includes a first OB clamp processor which corrects the second signals of the unit pixels included in the opening region in the pixel region based on differences between the first signals and the second signals of the unit pixels included in the light shielding region in the pixel region and corrects the third signals of the unit pixels included in the opening region in the pixel region based on differences between the first signals and the third signals of the unit pixels included in the light shielding region in the pixel region, and
the first OB clamp processor operates when the imaging condition is the first condition.

8. The imaging apparatus according to claim 7, wherein the OB clamp processor includes a second OB clamp processor which corrects signals of the unit pixels included in the opening region in the pixel region based on error amounts between signals of the unit pixels included in the light shielding region in the pixel region and a dark level target value, and
the second OB clamp processor operates when the imaging condition is the first condition and the second condition.

9. The imaging apparatus according to claim 1, wherein the imaging condition includes an ISO speed.

10. The imaging apparatus according to claim 1, wherein the imaging condition includes a shutter speed.

11. A method for driving an imaging apparatus having a pixel region including a plurality of unit pixels arranged in a matrix, each of the unit pixels including a micro lens and first and second photoelectric conversion units receiving light which is transmitted through the micro lens, the method comprising:
reading first signals obtained by mixing signals of the first and second photoelectric conversion units in rows of a first reading mode and reading second signals at least including signals of the first photoelectric conversion units and third signals at least including signals of the second photoelectric conversion units in rows of a second reading mode; and
correcting signals in the unit pixels included in an opening region in the pixel region based on signals output from the unit pixels included in a light shielding region in the pixel region,
wherein one of various correction processes is performed depending on an imaging condition in the correcting.

12. The method according to claim 11, wherein the second signals are output from the first photoelectric conversion units, and
the third signals are output from the second photoelectric conversion units.

13. The method according to claim 11, wherein the second signals are output from the first photoelectric conversion units, and
the third signals are obtained by mixing the signals output from the first and second photoelectric conversion units.

14. The method according to claim 11, further comprising:
correcting the second signals of the unit pixels included in the opening region in the pixel region based on the first signals and the second signals of the unit pixels included in the light shielding region in the pixel region and corrects the third signals of the unit pixels in the opening region in the pixel region based on the first signals and the third signals of the unit pixels included in the light shielding region in the pixel region when the imaging condition is a first condition; and
correcting the second signals of the unit pixels included in the opening region in the pixel region based on the second signals of the unit pixels included in the light shielding region in the pixel region and corrects the third signals of the unit pixels included in the opening region in the pixel region based on the third signals of the unit pixels included in the light shielding region in the pixel region when the imaging condition is a second condition.

15. The method according to claim 11,
wherein the correcting includes
- first correcting the second signals of the unit pixels included in the opening region in the pixel region based on the first signals and the second signals of the unit pixels included in the light shielding region in the pixel region and corrects the third signals of the unit pixels included in the opening region in the pixel region based on the first signals and the third signals of the unit pixels included in the light shielding region in the pixel region, and
- second correcting the second signals of the unit pixels included in the opening region in the pixel region based on the second signals of the unit pixels included in the light shielding region in the pixel region and corrects the third signals of the unit pixels included in the opening region in the pixel region based on the third signals of the unit pixels included in the light shielding region in the pixel region, the first correcting performs correction when the imaging condition is a first condition, and the first correcting performs correction and the second correcting performs correction on signals which have been corrected by the first correcting when the imaging condition is the second condition.

16. The method according to claim 11,
wherein the reading
- performs reading in the first reading mode on a number of rows of the plurality of unit pixels and performs reading in the second reading mode on the other rows of the plurality of unit pixels when the imaging condition is a first condition, and
- performs reading in the first reading mode on all the rows of the plurality of unit pixels when the imaging condition is a second condition.

17. The method according to claim 16,
wherein the correcting includes a first correcting which corrects the second signals of the unit pixels included in the opening region in the pixel region based on differences between the first signals and the second signals of the unit pixels included in the light shielding region in the pixel region and corrects the third signals of the unit pixels included in the opening region in the pixel region based on differences between the first signals and the third signals of the unit pixels included in the light shielding region in the pixel region, and the first correcting is performed when the imaging condition is the first condition.

18. The method according to claim 17,
wherein the correcting further includes a second correcting which corrects signals of the unit pixels included in the opening region in the pixel region based on error amounts between signals of the unit pixels included in the light shielding region in the pixel region and a dark level target value, and the second correcting is performed when the imaging condition is the first condition and the second condition.

19. The method according to claim 11, wherein the imaging condition includes an ISO speed.

20. The method according to claim 11, wherein the imaging condition includes a shutter speed.

* * * * *